(12) United States Patent
Akasegawa

(10) Patent No.: US 8,933,765 B2
(45) Date of Patent: Jan. 13, 2015

(54) FILTER, TRANSMITTER-RECEIVER, AND AMPLIFYING CIRCUIT

(75) Inventor: Akihiko Akasegawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 811 days.

(21) Appl. No.: 12/859,573

(22) Filed: Aug. 19, 2010

(65) Prior Publication Data

US 2011/0081873 A1  Apr. 7, 2011

(30) Foreign Application Priority Data

Oct. 2, 2009  (JP) ................................. 2009-230555
Mar. 1, 2010  (JP) ................................. 2010-044155

(51) Int. Cl.
*H01P 3/08* (2006.01)
*H01P 5/12* (2006.01)

(52) U.S. Cl.
USPC ........... 333/134; 333/128; 333/129; 333/204; 333/246

(58) Field of Classification Search
USPC .................. 333/127–129, 134, 202, 204, 246
See application file for complete search history.

(56) References Cited

U.S. PATENT DOCUMENTS

| | | | | |
|---|---|---|---|---|
| 3,343,069 A | * | 9/1967 | Tsuda | 307/424 |
| 3,345,589 A | * | 10/1967 | Di Piazza | 333/204 |
| 3,662,294 A | * | 5/1972 | Jacobs et al. | 333/33 |
| 4,074,214 A | * | 2/1978 | Aichholzer | 333/204 |
| 4,211,977 A | * | 7/1980 | Shinkawa et al. | 455/326 |
| 4,489,292 A | * | 12/1984 | Ogawa | 333/202 |
| 2002/0113666 A1 | | 8/2002 | Yamazaki et al. | 333/109 |
| 2010/0164632 A1 | | 7/2010 | Blednov et al. | 330/310 |

FOREIGN PATENT DOCUMENTS

| | | | |
|---|---|---|---|
| CN | 1383591 | | 12/2002 |
| CN | 101379696 | | 3/2009 |
| JP | 6-204764 | | 7/1994 |
| JP | 7-94974 | | 4/1995 |
| JP | 9-238025 | | 9/1997 |
| JP | 9-275319 | | 10/1997 |
| JP | 11-234062 | | 8/1999 |
| JP | 2002-84113 A1 | | 3/2002 |
| JP | 2006-136028 | | 5/2006 |
| JP | 2006185936 A | * | 7/2006 |
| JP | 2006-229840 A1 | | 8/2006 |

OTHER PUBLICATIONS

First Office Action received from The State Intellectual Property Office of the People's Republic of China in counterpart application No. 201010287992.2 issued Feb. 27, 2013 with English translation (18 pages).
Japanese Office Action mailed Oct. 15, 2013 (with Partial English Translation) in counterpart Japanese Application No. 2010-044155.

\* cited by examiner

*Primary Examiner* — Robert Pascal
*Assistant Examiner* — Kimberly Glenn
(74) *Attorney, Agent, or Firm* — Kratz, Quintos & Hanson, LLP

(57) ABSTRACT

A filter includes: an input terminal to which a fundamental wave signal and a harmonic signal group of the fundamental wave signal are supplied; an output terminal configured to output the fundamental wave signal supplied to the input terminal; a transmission line configured to connect the input terminal and the output terminal; an open-end stub configured to be provided corresponding to an odd harmonic signal among the harmonic signal group, coupled to the transmission line, and has a length corresponding to one quarter of a wavelength of the corresponding odd harmonic signal; a first short-end stub configured to be coupled to the transmission line and has a length corresponding to one quarter of a wavelength of the fundamental wave signal; and a second short-end stub configured to be coupled to the transmission line.

19 Claims, 20 Drawing Sheets

FILTER, TRANSMITTER-RECEIVER, AND AMPLIFYING CIRCUIT

CROSS-REFERENCE TO RELATED APPLICATION(S)

This application is based upon and claims the benefit of priority of the prior Japanese Patent Application No. 2009-230555, filed on Oct. 2, 2009 and No. 2010-044155, filed on Mar. 1, 2010, the entire contents of which are incorporated herein by reference.

FIELD

The embodiments discussed herein are related to a filter, a transmitter-receiver, and an amplifying circuit.

BACKGROUND

As a filter for processing harmonic signals, there exists a filter to which a fundamental wave signal and harmonic signals having an integer multiple of a frequency of a fundamental wave signal are supplied and which suppresses the harmonic signals among these signals and outputs the fundamental wave signal.

The above-described filter is provided on an output portion of nonlinear elements such as an amplifier and a mixer. In a nonlinear element, together with an input of a fundamental wave signal, harmonic signals may be generated and output. In this case, there is the possibility that the harmonic signals cause electromagnetic interference to other components or systems. When the above-described filter is provided on an output portion of this nonlinear element, the harmonic signals can be suppressed.

As one of the above-described filters, there exists a filter including an input terminal, an output terminal, a transmission line connecting the input terminal and the output terminal, and an open-end stub configured to be provided corresponding to a supplied harmonic signal, coupled to the transmission line, and has a length corresponding to one quarter of a wavelength of the corresponding harmonic signal.

Each open-end stub makes short a connection node to the transmission line for a corresponding harmonic signal and suppresses the corresponding harmonic signal. On the other hand, each open-end stub makes open the connection node to the transmission line for the fundamental wave signal and passes the fundamental wave signal. As a result, the filter enables harmonic signals to be suppressed among the supplied fundamental wave signal and harmonic signals, and the fundamental wave signal to be produced from the output terminal.

FIG. 1 illustrates one example of this conventional filter. The illustrated conventional filter 100 has an input terminal 110, an output terminal 120, a transmission line 130 connecting the input terminal 110 and the output terminal 120, and open-end stubs 142, 143, 144, 145, and 146 coupled to the transmission line 130 through a connection node 131. Here, the characteristic impedance Z0 of the transmission line 130 is 50Ω.

To the input terminal 110 of the filter 100, a fundamental wave signal f0 and harmonic signals having an integer multiple of the frequency of the fundamental wave signal f0 are supplied. Here, suppose that a second harmonic signal 2f0 having twice the frequency, a third harmonic signal 3f0 having three times the frequency, a fourth harmonic signal 4f0 having four times the frequency, a fifth harmonic signal 5f0 having five times the frequency, and a sixth harmonic signal 6f0 having six times the frequency are supplied to the input terminal 110. Here, the frequency of the fundamental wave signal f0 is 1.300 GHz.

The open-end stubs 142 to 146 are provided respectively corresponding to the supplied harmonic signals 2f0 to 6f0, and have lengths corresponding to one quarter of wavelengths of the corresponding harmonic signals.

Here, the open-end stub 142 is provided corresponding to the second harmonic signal 2f0, and has a length (i.e., a length corresponding to one eighth of the wavelength λf0 of the fundamental wave signal f0) corresponding to one quarter of a wavelength λ2f0 of the second harmonic signal 2f0. The open-end stub 142 makes short the connection node 131 to the transmission line 130 for the second harmonic signal 2f0, and suppresses the second harmonic signal 2f0.

The open-end stub 143 is provided corresponding to the third harmonic signal 3f0, and has a length corresponding to one quarter of a wavelength λ3f0 of the third harmonic signal 3f0 (i.e., a length corresponding to one twelfth of the wavelength λf0 of the fundamental wave signal f0). The open-end stub 143 makes short the connection node 131 to the transmission line 130 for the third harmonic signal 3f0, and suppresses the third harmonic signal 3f0.

The open-end stub 144 is provided corresponding to the fourth harmonic signal 4f0, and has a length (i.e., a length corresponding to one sixteenth of the wavelength λf0 of the fundamental wave signal f0) corresponding to one quarter of a wavelength λ4f0 of the fourth harmonic signal 4f0. The open-end stub 144 makes short the connection node 131 to the transmission line 130 for the fourth harmonic signal 4f0, and suppresses the fourth harmonic signal 4f0.

The open-end stub 145 is provided corresponding to the fifth harmonic signal 5f0, and has a length (i.e., a length corresponding to one twentieth of the wavelength λf0 of the fundamental wave signal f0) corresponding to one quarter of a wavelength λ5f0 of the fifth harmonic signal 5f0. The open-end stub 145 makes short the connection node 131 to the transmission line 130 for the fifth harmonic signal 5f0, and suppresses the fifth harmonic signal 5f0.

The open-end stub 146 is provided corresponding to the sixth harmonic signal 6f0, and has a length (i.e., a length corresponding to one twenty-fourth of the wavelength λf0 of the fundamental wave signal f0) corresponding to one quarter of a wavelength λ6f0 of the sixth harmonic signal 6f0. The open-end stub 146 makes short the connection node 131 to the transmission line 130 for the sixth harmonic signal 6f0, and suppresses the sixth harmonic signal 6f0.

On the other hand, each open-end stub 142 to 146 makes open the connection node 131 to the transmission line 130 for the fundamental wave signal f0, and passes the fundamental wave signal f0. As a result, the filter 100 enables the harmonic signals 2f0 to 6f0 to be suppressed and the fundamental wave signal f0 to be produced from the output terminal 120 among the supplied fundamental wave signal f0 and harmonic signals 2f0 to 6f0 thereof.

As another filter using an open-end stub, there exists a filter which suppresses a fundamental wave signal using an open-end stub and passes a second harmonic signal (e.g., Japanese Laid-open Patent publication No. 2006-229840). Further, there exists a directional coupler (e.g., Japanese Laid-open Patent publication No. 2002-084113) using an open-end stub or a 3-multiple frequency circuit (e.g., Japanese Laid-open Patent publication No. 09-275319) using an open-end stub.

However, there is the possibility that the conventional filter using an open-end stub attenuates the fundamental wave signal f0 as a pass signal.

SUMMARY

According to one aspect of the present invention, this filter includes: an input terminal to which a fundamental wave signal and a harmonic signal group of the fundamental wave signal are supplied; an output terminal configured to output the fundamental wave signal supplied to the input terminal; a transmission line configured to connect the input terminal and the output terminal; an open-end stub configured to be provided corresponding to an odd harmonic signal among the harmonic signal group, coupled to the transmission line, and has a length according to one quarter of a wavelength of the corresponding odd harmonic signal; a first short-end stub configured to be coupled to the transmission line and has a length according to one quarter of a wavelength of the fundamental wave signal; and a second short-end stub configured to be coupled to the transmission line.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

Figure 1:
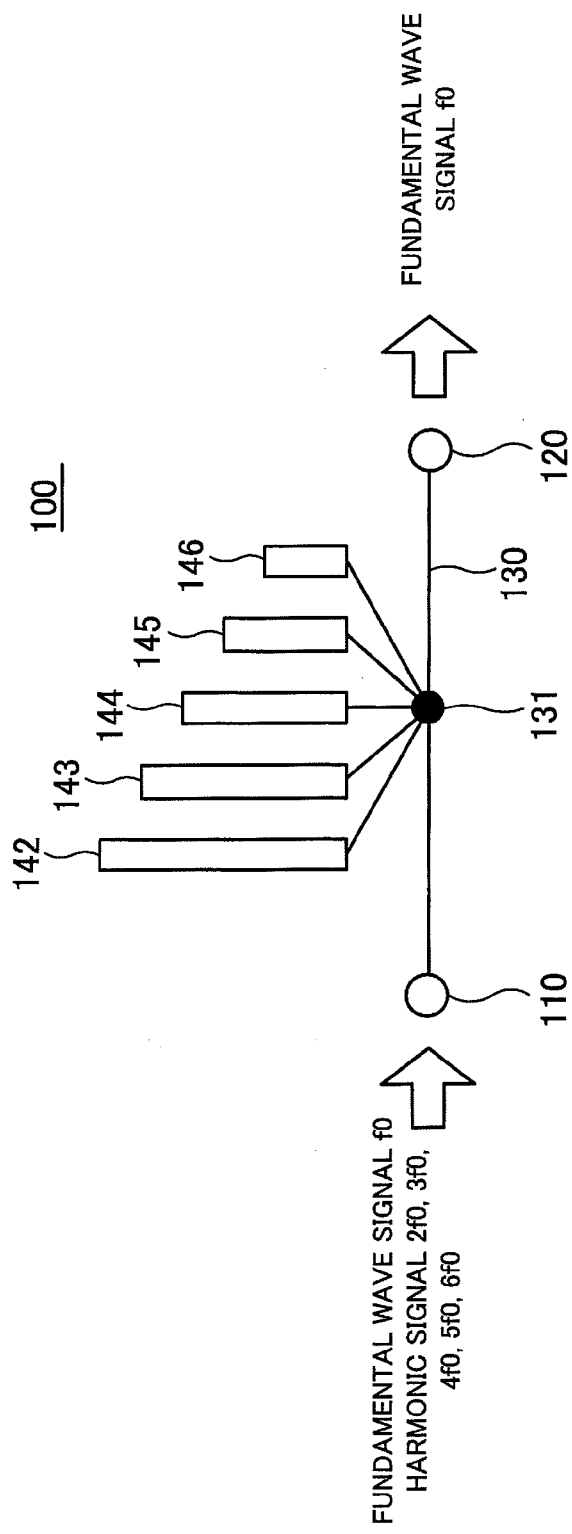
FIG. 1 illustrates one example of a conventional filter.

Preferred embodiments of the present invention will now be described in detail below with reference to the accompanying drawings, wherein like reference numerals refer to like elements throughout.

First Embodiment

Figure 2:
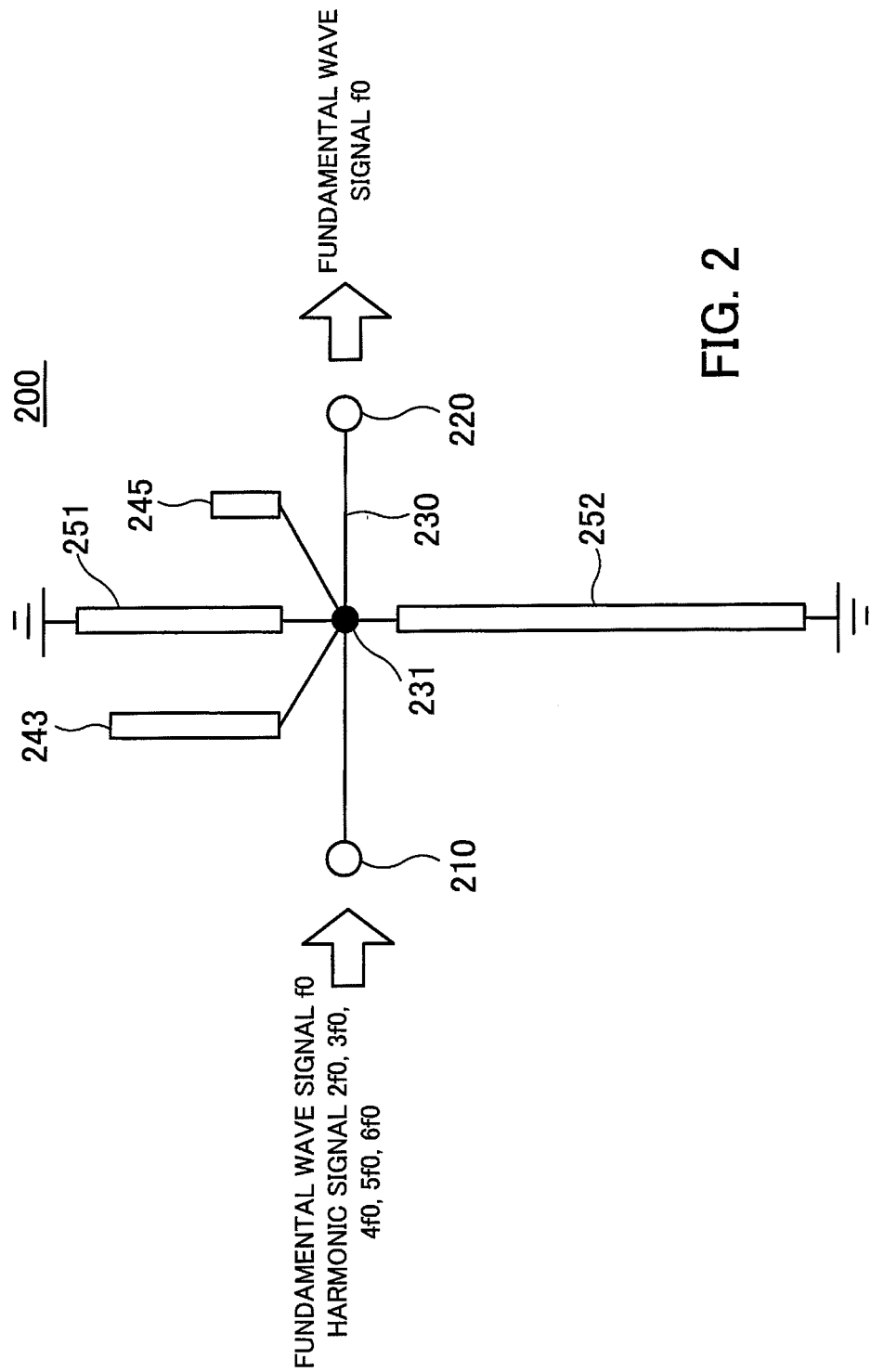
FIG. 2 illustrates one example of a filter according to a first embodiment.

FIG. 2 illustrates one example of a filter according to a first embodiment. The illustrated filter 200 according to the first embodiment includes an input terminal 210, an output terminal 220, a transmission line 230 connecting the input terminal 210 and the output terminal 220, open-end stubs 243 and 245 and short-end stubs 251 and 252 coupled to the transmission line 230 through a connection node 231. Here, the characteristic impedance Z0 of the transmission line 230 is 50Ω.

As illustrated in FIG. 2, among stubs connecting one end to the transmission line 230, a stub the other end of which is opened is referred to as the open-end stubs 243 and 245, and a stub the other end of which is shorted is referred to as the short-end stubs 251 and 252.

To the input terminal 210, a fundamental wave signal f0 and harmonic signals having an integer multiple of a frequency of the fundamental wave signal f0 are supplied. Here, suppose that a second harmonic signal 2f0 having twice the frequency, a third harmonic signal 3f0 having three times the frequency, a fourth harmonic signal 4f0 having four times the frequency, a fifth harmonic signal 5f0 having five times the frequency, and a sixth harmonic signal 6f0 having six times the frequency are supplied to the input terminal 210.

Among the fundamental wave signal f0 and its harmonic signals 2f0, 3f0, 4f0, 5f0, and 6f0 supplied to the input terminal 210, the filter 200 suppresses the harmonic signals 2f0, 3f0, 4f0, 5f0, and 6f0, and produces the fundamental wave signal f0 from the output terminal 220.

When having the short-end stub 251, the filter 200 can reduce the attenuation amount of the fundamental wave signal f0. The reason of the reduction will be described below.

Figure 3:
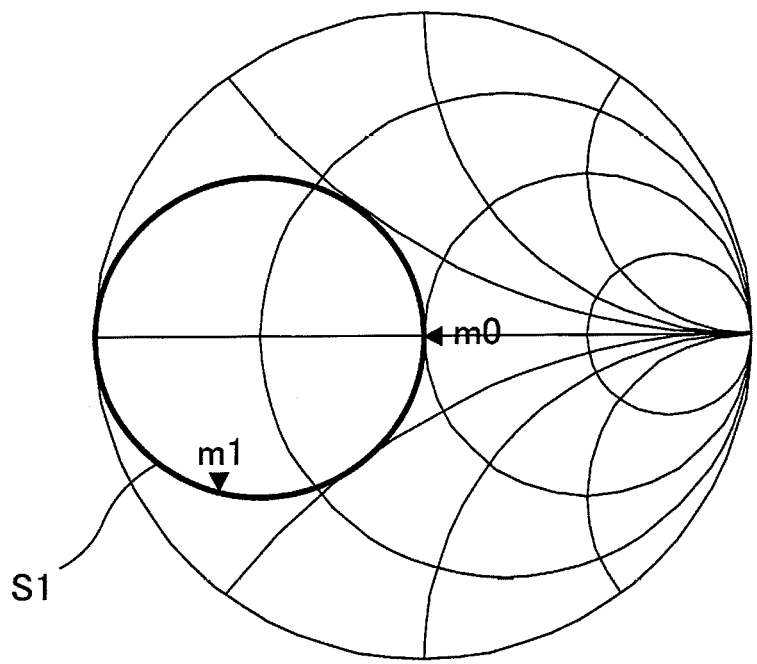
FIG. 3 illustrates a Smith Chart corresponding to the filter of FIG. 1.

FIG. 3 illustrates a Smith Chart corresponding to the filter of FIG. 1. Here, the frequency of the fundamental wave signal f0 is 1.300 GHz. As illustrated in FIG. 3, impedance of the fundamental wave signal f0 is, for example, 6.511-j16.827Ω and located at a point illustrated in a symbol m1 of the Smith Chart.

The symbol m1 is located at a point advanced in a clockwise direction from a symbol m0 as a matching point on an equal conductance circle S1. The above-described state corresponds to a case where a capacitor is coupled in parallel to the transmission line 130 of the filter 100. This state is considered to be caused by ground capacitance generated between the open-end stubs 142 to 146 and the ground lines (not illustrated). For the purpose, the fundamental wave signal f0 is considered to be attenuated.

As compared with the above-described case, when a short-end stub is coupled to the transmission line 130, the state corresponds to a case where an inductor is coupled in parallel to the transmission line 130. In FIG. 3, the symbol m1 can be advanced in a counterclockwise direction on the equal conductance circle S1. The amount of advance can be adjusted based on a length of the short-end stub. This process permits the symbol m1 to be approximated to the symbol m0 as a matching point. That is, this process permits impedance matching to be performed with respect to the fundamental wave signal f0.

From the above-described reason, in the filter 200, the ground capacitance generated by the open-end stubs 243 and 245 can be eliminated by the short-end stub 251. This process permits the impedance matching to be performed with respect to the fundamental wave signal f0 and the attenuation amount of the fundamental wave signal f0 to be reduced. Here, the short-end stub 251 has a length corresponding to one eighth of the wavelength λf0 of the fundamental wave signal f0.

Figure 4:
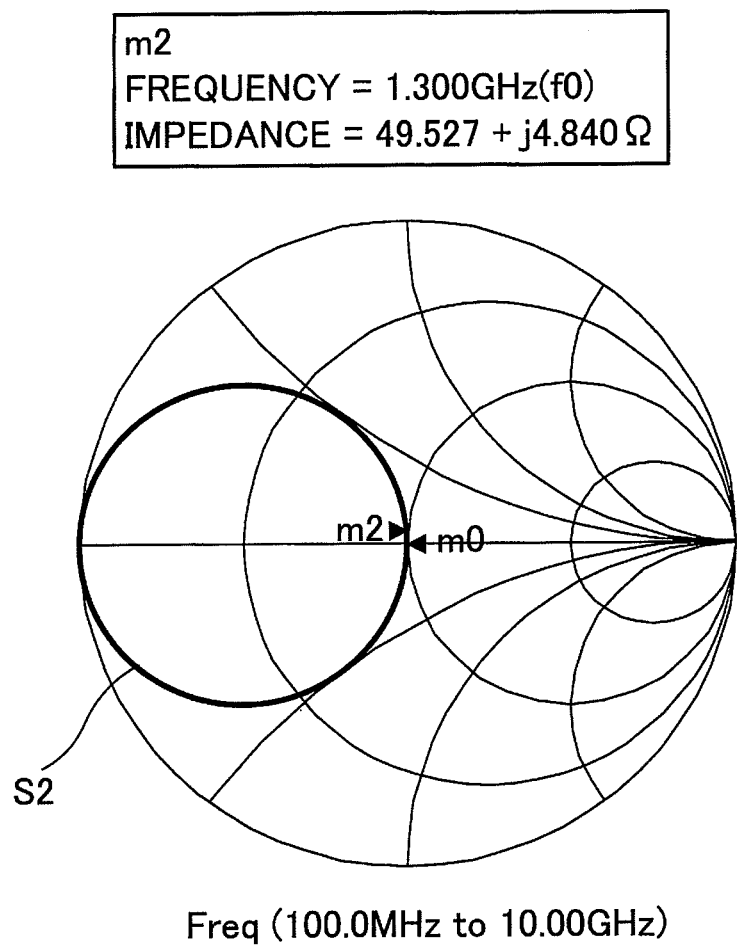
FIG. 4 illustrates the Smith Chart corresponding to the filter according to the first embodiment.

FIG. 4 illustrates a Smith Chart corresponding to the filter according to the first embodiment. In the filter 200, as illustrated in FIG. 4, the impedance with respect to the fundamental wave signal f0 is, for example, 49.527+j4.840Ω and located at a point illustrated in a symbol m2 of the Smith Chart. The symbol m2 is located in the vicinity of the symbol m0 as a matching point on an equal conductance circle S2. The above-described fact represents that the impedance matching is performed with respect to the fundamental wave signal f0.

Next, returning to FIG. 2, the open-end stubs 243 and 245 will be described. The open-end stubs 243 and 245 are provided respectively corresponding to the odd harmonic signals 3f0 and 5f0 among the supplied harmonic signals 2f0 to 6f0.

Here, the open-end stub 243 is provided corresponding to the third harmonic signal 3f0, and has a length (i.e., a length corresponding to one twelfth of the wavelength λf0 of the fundamental wave signal f0) corresponding to one quarter of a wavelength λ3f0 of the third harmonic signal 3f0. The open-end stub 243 permits the connection node 231 to the transmission line 230 to be short with respect to the third harmonic signal 3f0, and suppresses the third harmonic signal 3f0.

The open-end stub 245 is provided corresponding to the fifth harmonic signal 5f0, and has a length (i.e., a length corresponding to one twentieth of the wavelength λf0 of the fundamental wave signal f0) corresponding to one quarter of a wavelength λ5f0 of the fifth harmonic signal 5f0. The open-end stub 245 permits the connection node 231 to the transmission line 230 to be short with respect to the fifth harmonic signal 5f0, and suppresses the fifth harmonic signal 5f0.

On the other hand, each open-end stub 243 and 245 permits the connection node 231 to the transmission line 230 to be open with respect to the fundamental wave signal f0, and passes the fundamental wave signal f0. Further, the number of the open-end stubs is not limited to two open-end stubs 243 and 245, and open-end stubs are appropriately provided according to the number of the odd harmonic signals to be suppressed.

Next, the short-end stub 252 will be described. The short-end stub 252 has a length corresponding to one quarter of the wavelength λf0 of the fundamental wave signal f0. Specifically, a length of the short-end stub 252 is equal to one corresponding to two fourths of the wavelength λ2f0 of the second harmonic signal 2f0, one corresponding to four fourths of the wavelength λ4f0 of the fourth harmonic signal 4f0, and one corresponding to six fourths of the wavelength λ6f0 of the sixth harmonic signal 6f0, respectively. That is, a length of the short-end stub 252 is equal to an even multiple of a length corresponding to one quarter of each wavelength λ2f0, λ4f0, and λ6f0.

As a result, the short-end stub 252 permits the connection node 231 to the transmission line 230 to be short with respect to the even harmonic signals 2f0, 4f0, and 6f0, and suppresses the even harmonic signals 2f0, 4f0, and 6f0. On the other hand, the short-end stub 252 permits the connection node 231 to the transmission line 230 to be open with respect to the fundamental wave signal f0, and passes the fundamental wave signal f0.

As can be seen from the above discussion, the providing of the short-end stub 252 permits the even harmonic signals 2f0, 4f0, and 6f0 to be suppressed. Therefore, as in the conventional filter 100, open-end stubs need not be provided with respect to the even harmonic signals 2f0, 4f0, and 6f0, respectively. As a result, this permits an area occupied by open-end stubs or short-end stubs to be reduced and a reduction in the size of the filter 200 to be realized.

Figure 5:
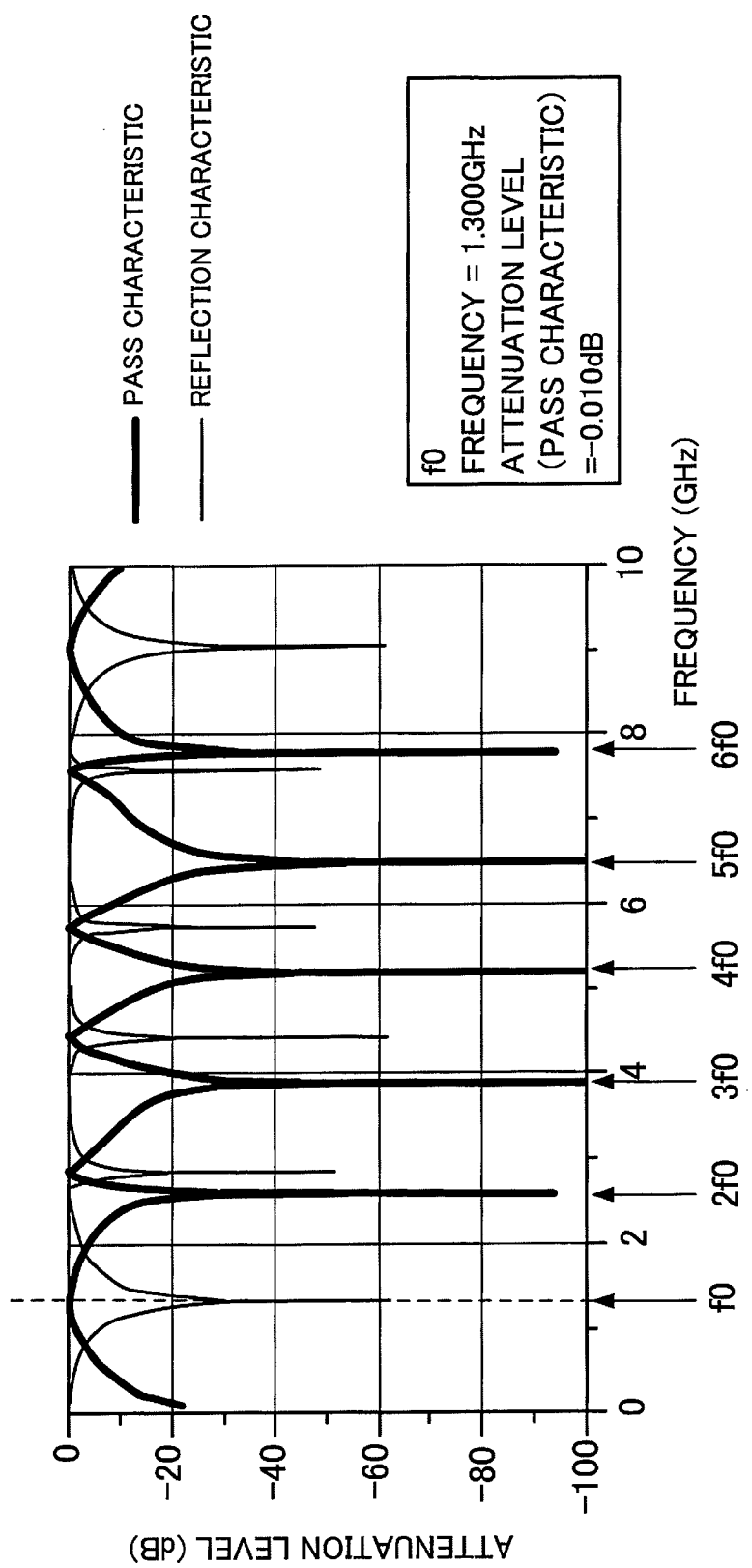
FIG. 5 illustrates simulation results of pass characteristics of the filter according to the first embodiment.

FIG. 5 illustrates simulation results of pass characteristics of the filter according to the first embodiment. The horizontal axis of the graph of FIG. 5 represents the frequency (GHz), and the vertical axis represents the attenuation level (dB). FIG. 5 illustrates pass characteristics and reflection characteristics.

As can be seen from the pass characteristics illustrated in the graph of FIG. 5, each harmonic signal 2f0 to 6f0 is significantly attenuated in the filter 200. Further, as can be seen from the graph of FIG. 15, the pass characteristic in 1.300 GHz as the frequency of the fundamental wave signal f0 is −0.010 dB and the fundamental wave signal f0 is scarcely attenuated.

Figure 6:
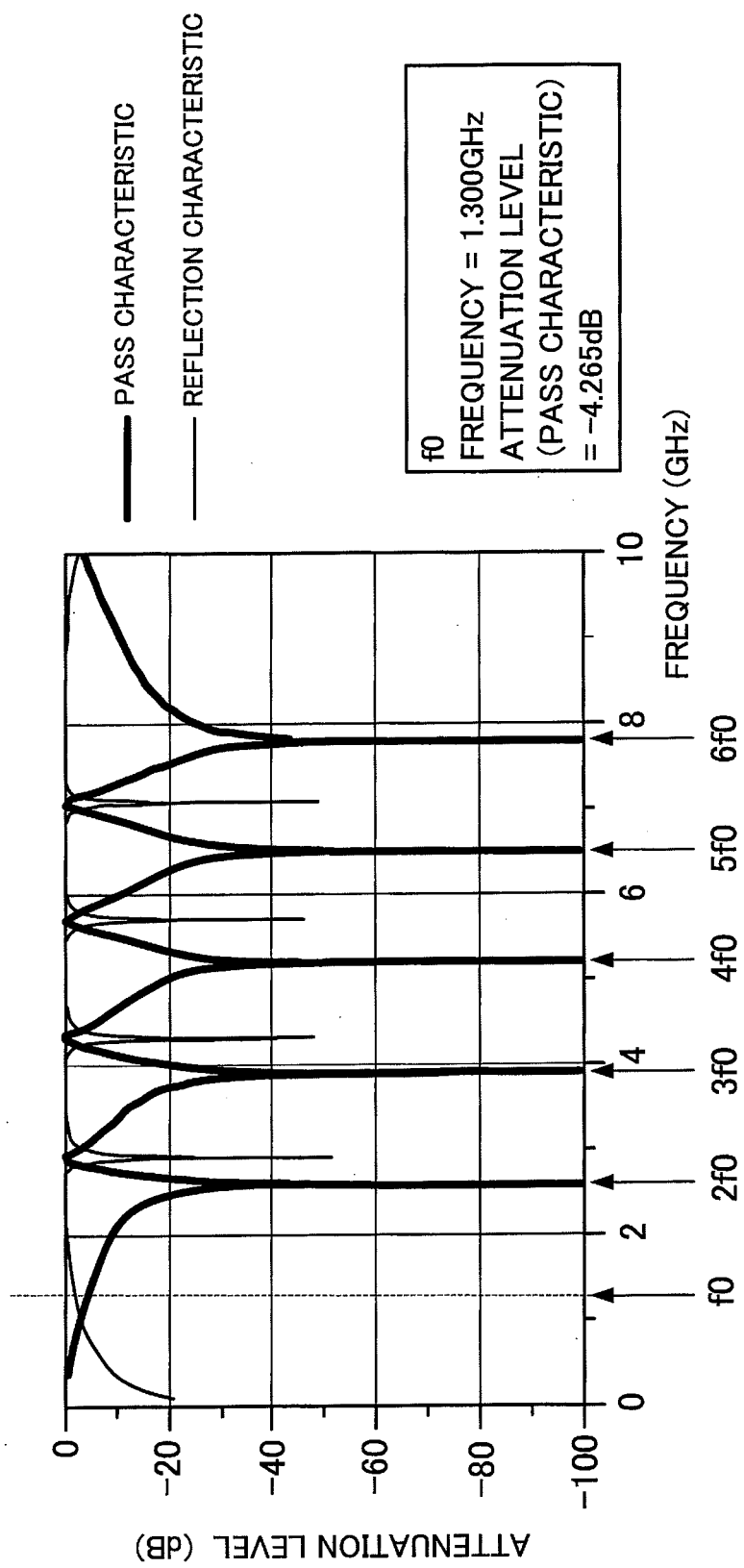
FIG. 6 illustrates simulation results of pass characteristics of the filter of FIG. 1.

On the other hand, FIG. 6 illustrates simulation results of the pass characteristic of the filter of FIG. 1. As can been seen from the graph of FIG. 6, the attenuation level in 1.300 GHz as the frequency of the fundamental wave signal f0 is −4.265 dB and the fundamental wave signal f0 is attenuated.

As can be seen from the above discussion, the proposed filter 200 according to the first embodiment can suppress the harmonic signals 2f0 to 6f0 and reduce the attenuation amount of the fundamental wave signal f0 as pass signals.

Second Embodiment

A filter according to a second embodiment corresponds to one obtained by applying a microstrip line to the filter 200 according to the first embodiment.

Figure 7:
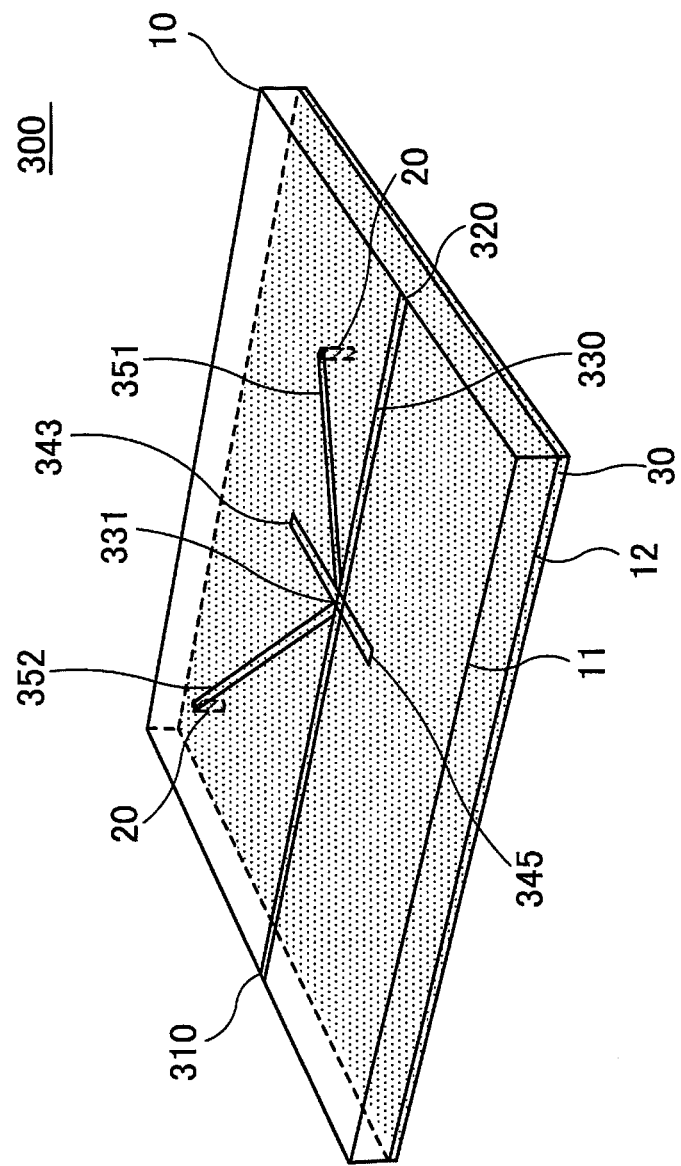
FIG. 7 is a perspective view illustrating one example of the filter according to a second embodiment.
Figure 8:
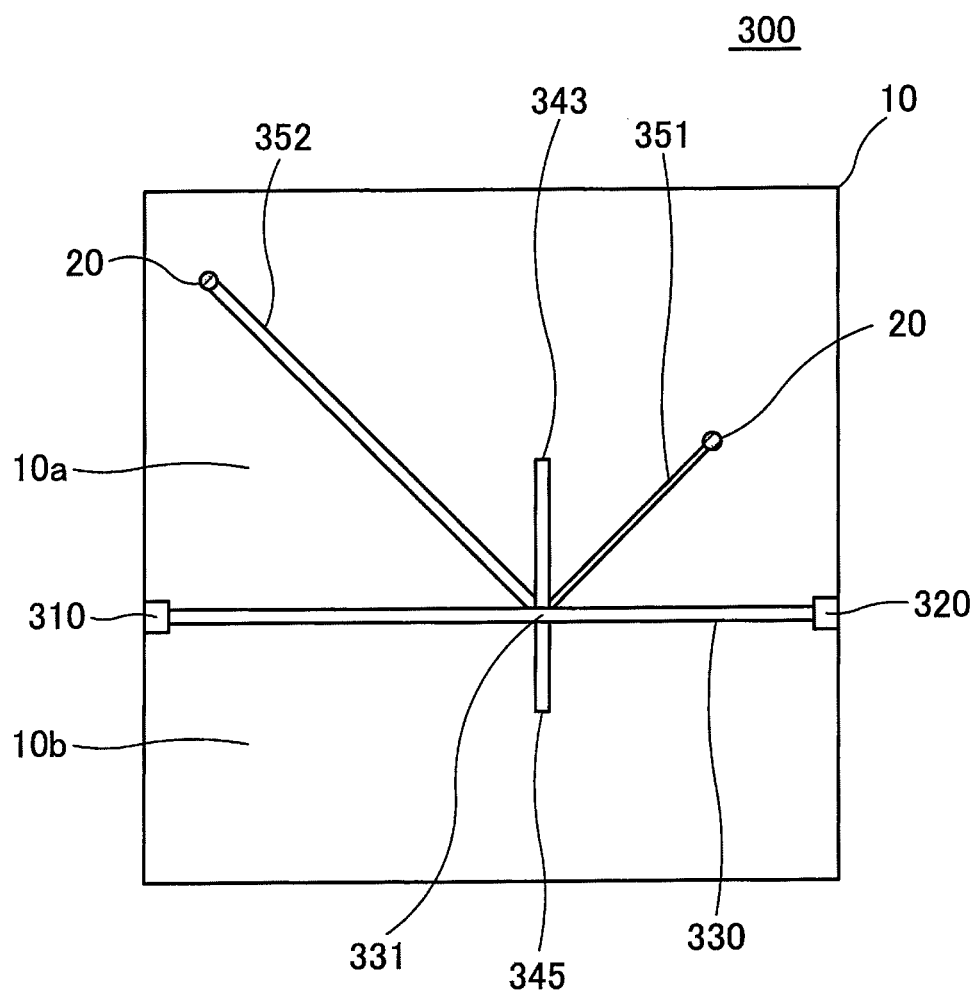
FIG. 8 is a top view of FIG. 7.

FIG. 7 is a perspective view illustrating one example of the filter according to the second embodiment. FIG. 8 is a top view of FIG. 7.

The illustrated filter 300 according to the second embodiment includes a surface 11, a surface 12 of an opposite side to the surface 11, and a substrate 10 having connection vias 20 connecting the surfaces 11 and 12. As the substrate 10, for example, a low-loss dielectric substrate composed of alumina as a material is used.

On the surface 11 of the substrate 10, an input terminal 310, an output terminal 320, and a transmission line 330 connecting the input terminal 310 and the output terminal 320 are formed. Further, on the surface 11 of the substrate 10, open-end stubs 343 and 345 and short-end stubs 351 and 352 configured to be coupled to the transmission line 330 through a connection node 331 respectively are formed.

To the input terminal 310, the fundamental wave signal f0 and its harmonic signals having an integer multiple of the frequency of the fundamental wave signal f0 are supplied. Here, suppose that the second harmonic signal 2f0 having twice the frequency, the third harmonic signal 3f0 having three times the frequency, the fourth harmonic signal 4f0 having four times the frequency, the fifth harmonic signal 5f0 having five times the frequency, and the sixth harmonic signal 6f0 having six times the frequency are supplied to the input terminal 310. Here, the frequency of the fundamental wave signal f0 is, for example, 1.300 GHz.

The filter 300 suppresses the harmonic signals 2f0 to 6f0 and produces the fundamental wave signal f0 from the output terminal 320 among the fundamental wave signal f0 and its harmonic signals 2f0 to 6f0 supplied to the input terminal 310.

The input terminal 310, the output terminal 320, the transmission line 330, the open-end stubs 343 and 345, and the short-end stubs 351 and 352 are formed using conductive patterns. Examples of materials of the conductive pattern include gold (Au), silver (Ag), and copper (Cu). Here, a film thickness of each conductive pattern is, for example, preferably approximately 10 μm in order to realize low loss. The characteristic impedance Z0 of the transmission line 330 is 50Ω.

The open-end stubs 343 and 345 are provided respectively corresponding to the odd harmonic signals 3f0 and 5f0 among the supplied harmonic signals 2f0 to 6f0. Here, the open-end stub 343 has a length corresponding to one quarter of the wavelength λ3f0 of the third harmonic signal 3f0. The open-end stub 345 has a length corresponding to one quarter of the wavelength λ5f0 of the fifth harmonic signal 5f0. In addition, the number of the open-end stubs is not limited to the two open-end stubs 343 and 345, and open-end stubs are appropriately provided according to the number of the odd harmonic signals to be suppressed.

The short-end stub 351 has a length corresponding to one eighth of the wavelength λf0 of the fundamental wave signal f0. The short-end stub 352 has a length corresponding to one quarter of the wavelength λf0 of the fundamental wave signal f0. On the surface 12 of the substrate 10, a ground pattern 30 is formed. The short-end stubs 351 and 352 are electrically connected to the ground pattern 30 through the connection vias 20, respectively.

Figure 9:
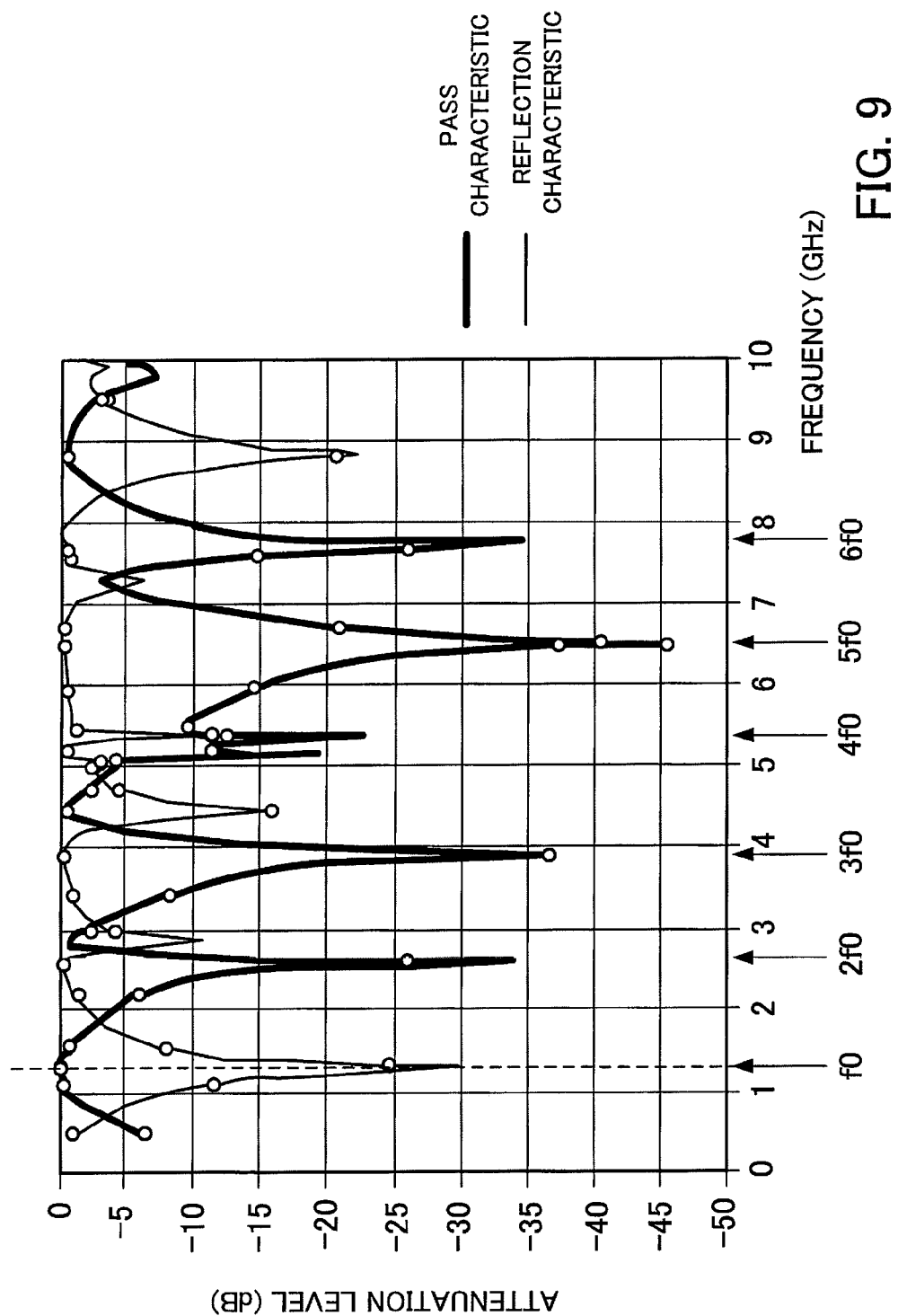
FIG. 9 illustrates results of an electromagnetic simulation of pass characteristics of the filter according to the second embodiment.

FIG. 9 illustrates the results of an electromagnetic simulation of the pass characteristic of the filter 300 according to the second embodiment. The horizontal axis of the graph of FIG. 9 represents the frequency (GHz) and the vertical axis represents the attenuation level (dB). FIG. 9 illustrates the pass characteristic and the reflection characteristic.

As can be seen from the pass characteristic illustrated in the graph of FIG. 9, each harmonic signal 2f0 to 6f0 is significantly attenuated in the filter 300. On the other hand, as can be seen from the graph of FIG. 9, the fundamental wave signal f0 is scarcely attenuated. From the same reason as in the description of the first embodiment, the open-end stubs 343 and 345 suppress the odd harmonic signals 3f0 and 5f0, the short-end stub 352 suppresses the even harmonic signals 2f0, 4f0, and 6f0, and the short-end stub 351 reduces the attenuation amount of the fundamental wave signal f0.

As can be seen from the above discussion, the proposed filter 300 according to the second embodiment can suppress the harmonic signals 2f0 to 6f0 and reduce the attenuation amount of the fundamental wave signal f0 as pass signals.

In the filter 300, the open-end stubs 343 and 345 and the short-end stubs 351 and 352 are coupled to the transmission line 330 at the common connection node 331. That is, the open-end stubs 343 and 345 and the short-end stubs 351 and 352 are concentrated and arranged at one position on the surface 11 of the substrate 10. For the purpose, a space area on the surface 11 of the substrate 10 can be reduced and further the size of the substrate 10 can be reduced as compared with a case where the open-end stubs 343 and 345 and the short-end stubs 351 and 352 are coupled to the transmission line 330 through different connection nodes, respectively. This process permits the reduction in the size of the filter 300 to be realized.

Further, this configuration permits one connection line connecting the open-end stubs 343 and 345 and another connection line connecting the short-end stubs 351 and 352 to be removed. This process makes it possible to suppress an influence given to the open-end stubs 343 and 345 and the short-end stubs 351 and 352 by the connection lines.

In the filter 300, the open-end stubs 343 and 345 and the short-end stubs 351 and 352 are arranged on both sides of the transmission line 330 on the surface 11 of the substrate 10. Specifically, as illustrated in FIG. 8, the open-end stubs 343 and the short-end stubs 351 and 352 are arranged in an area 10a of one side with respect to the transmission line 330, and the open-end stub 345 is arranged in an area 10b of the other side with respect to the transmission line 330.

As can be seen from the above discussion, when the open-end stubs 343 and 345 and the short-end stubs 351 and 352 are arranged in areas on both sides of the transmission line 330, distances between respective stubs can be largely kept as much as possible. This process permits both of stubs to be prevented from being influenced from each other and characteristics of respective stubs to be prevented from being deviated.

Third Embodiment

A filter according to a third embodiment corresponds to one obtained by removing the short-end stub 352 from the filter 300 according to the second embodiment.

Figure 10:
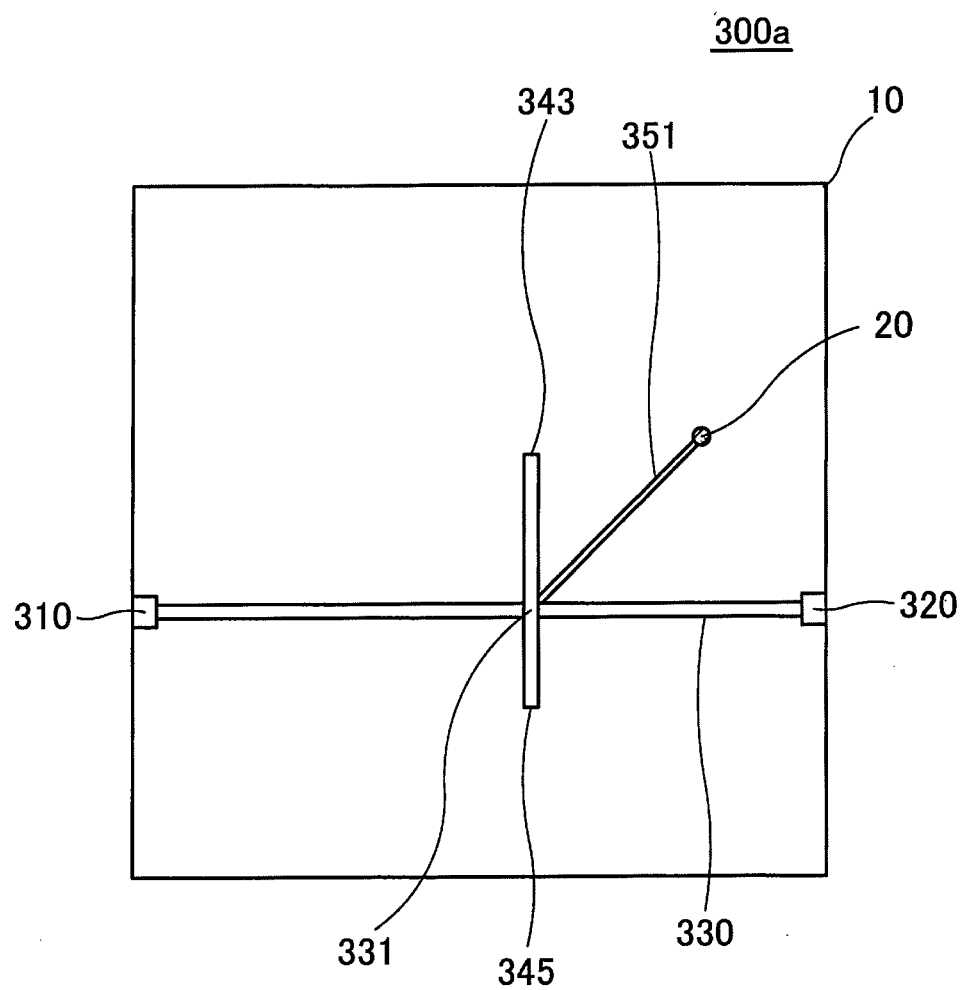
FIG. 10 is a top view illustrating one example of the filter according to a third embodiment.

FIG. 10 is a top view illustrating one example of the filter according to the third embodiment. As illustrated in FIG. 10, the filter 300a includes the input terminal 310, the output terminal 320, the transmission line 330, the open-end stubs 343 and 345, and the short-end stub 351. The characteristic impedance Z0 of the transmission line 330 is 50Ω.

Figure 11:
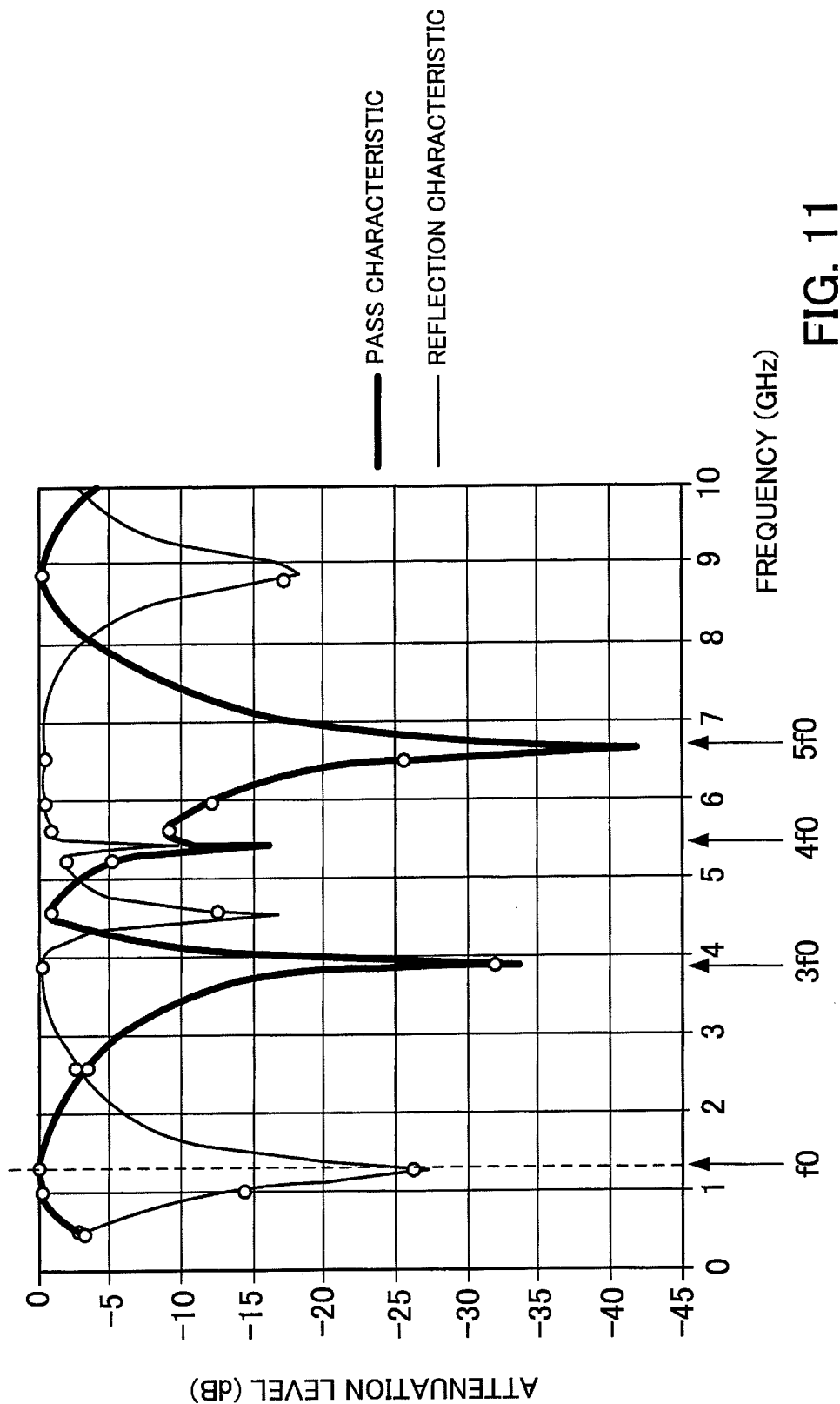
FIG. 11 illustrates results of an electromagnetic simulation of pass characteristics of the filter according to the third embodiment.

FIG. 11 illustrates the results of an electromagnetic simulation of the pass characteristic of the filter 300a according to the third embodiment. The horizontal axis of the graph of FIG. 11 represents the frequency (GHz) and the vertical axis represents the attenuation level (dB). FIG. 11 illustrates the pass characteristic and the reflection characteristic.

As can be seen from the pass characteristic illustrated in the graph of FIG. 11, the odd harmonic signals 3f0 and 5f0 are significantly attenuated in the filter 300a. On the other hand, as can be seen from the graph of FIG. 11, the fundamental wave signal f0 is scarcely attenuated. The reason is that the open-end stubs 343 and 345 suppress the odd harmonic signals 3f0 and 5f0, and the short-end stub 351 reduces the attenuation amount of the fundamental wave signal f0.

As can be seen from the graph of FIG. 11, the fourth harmonic signal 4f0 is attenuated although the filter 300a has no short-end stub 352 configured to suppress the even harmonic signals 2f0, 4f0, and 6f0. The reason is that a length (i.e., a length corresponding to one eighth of the wavelength λf0 of the fundamental wave signal f0) of the short-end stub 351 is equal to one (an even multiple of a length corresponding to one quarter of the wavelength 2λ4f0) corresponding to two fourths of the wavelength λ4f0 of the fourth harmonic signal 4f0. That is, the short-end stub 351 permits the connection node 331 to the transmission line 230 to be short with respect to the fourth harmonic signal 4f0, and suppresses the fourth harmonic signal 4f0.

Next, a prototype is fabricated based on the above-described filter 300a according to the third embodiment and the results in which the pass characteristic is actually measured are illustrated.

Figure 12:
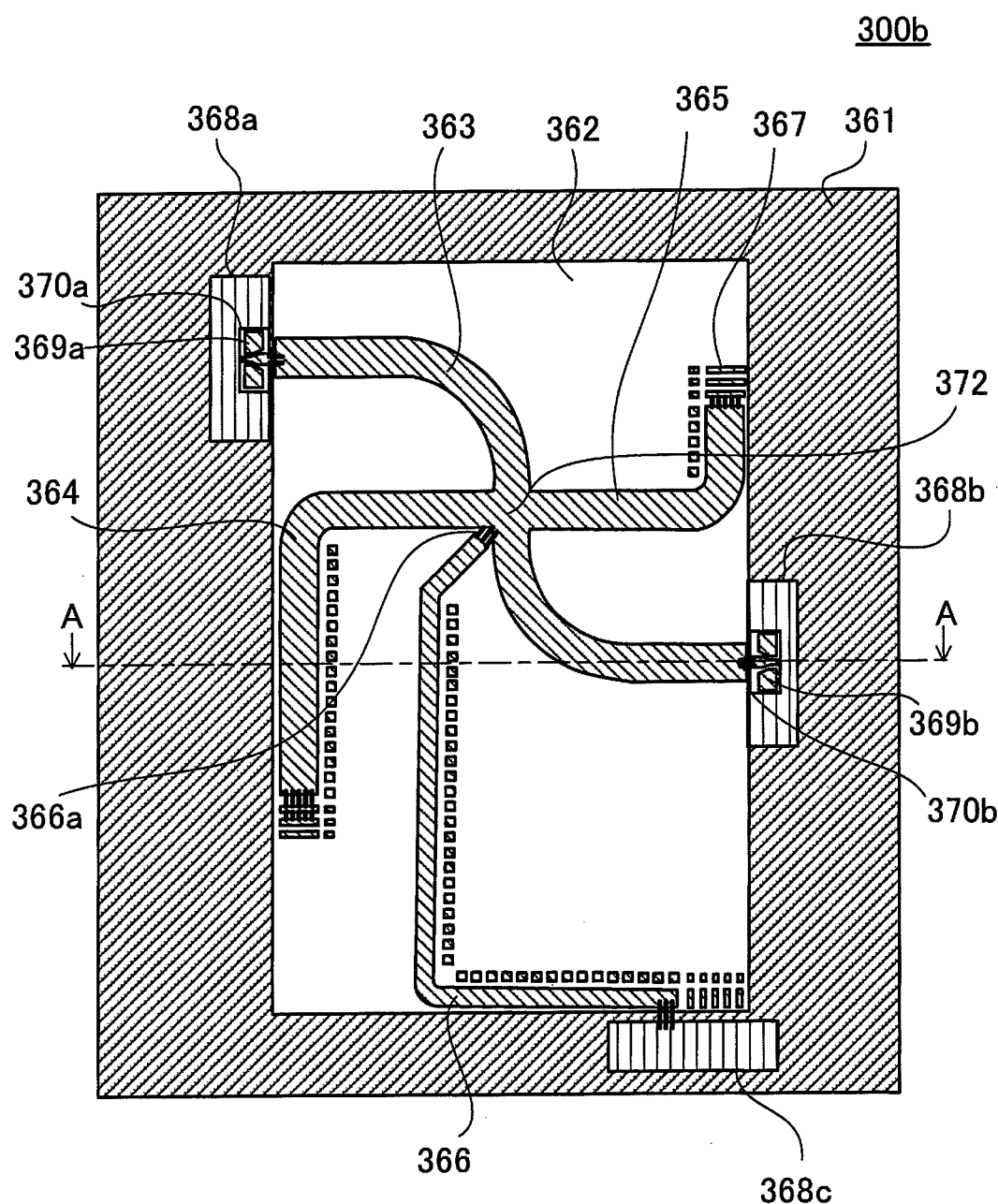
FIG. 12 is a top view illustrating a configuration of a prototype of the filter according to the third embodiment.
Figure 13:
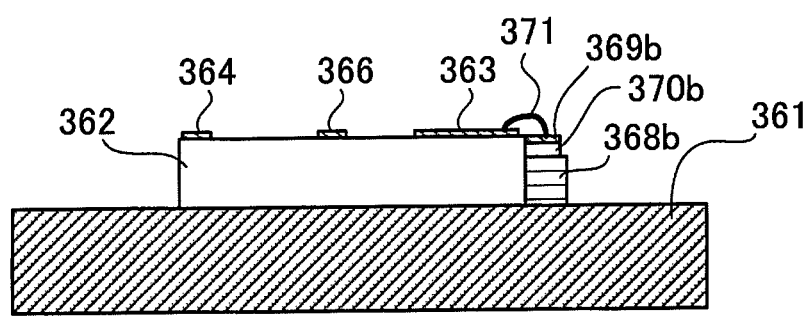
FIG. 13 is a cross sectional view taken along the line A-A of FIG. 12.

FIG. 12 is a top view illustrating a configuration of the prototype of the filter according to the third embodiment. Further, FIG. 13 is a cross sectional view taken along the line A-A of FIG. 12.

This filter 300b has a metal carrier 361 formed by plating a copper (Cu) plate with gold (Au), and an alumina substrate 362 joined by gold tin (Au—Sn) solder is formed on the metal carrier 361. A thickness of the alumina substrate 362 is determined in consideration of electric power resistance and mountability. For example, when considering power at the time of using 1.3 GHz band, a thickness of the alumina substrate 362 is preferably set to approximately 150 μm to 1 mm. In this prototype, a thickness of the alumina substrate 362 is set to approximately 635 μm. In addition, although the illustration is omitted, the entire opposite surface of the metal carrier 361 also is plated with gold for ground.

Over the alumina substrate 362, the transmission line 363, the open-end stubs 364 and 365, and the short-end stub 366 are formed with a conductive pattern of gold. The open-end stubs 364 and 365 and the short-end stub 366 are coupled to the transmission line 363 at the common connection node 372. A thickness of each conductive pattern is set to approximately 10 μm in order to realize low loss. The transmission line 363, and the open-end stubs 364 and 365 correspond to the transmission line 330, and the open-end stubs 343 and 345 of the filter 300a illustrated in FIG. 10, and may have substantially the same function as each other. Further, the short-end stub 366 corresponds to the short-end stub 351 illustrated in FIG. 10, and may have substantially the same function as each other.

Note that each of the open-end stubs 364 and 365 and the short-end stub 366 is bent to at least partly lie along different sides of the circumference of the alumina substrate 362. This process permits the reduction in the size of the filter 300a to be realized and a distance between the conductive patterns (respective stubs) to be extended, thereby suppressing generation of interference and capacitive coupling between the conductive patterns.

In this prototype, the short-end stub 366 is coupled to the transmission line 363 by gold wire bonding and a length of the short-end stub 366 can be simply fine-adjusted by adjusting a length of a gold wire 366a.

Also, on the alumina substrate 362, ends of the open-end stubs 364 and 365 and the short-end stub 366, and a plurality of adjustment lands 367 parallel to respective stubs are formed with conductive patterns of gold. When one or a plurality of the adjustment lands 367 are coupled to respective stubs by gold wire bonding, lengths of respective stubs for suppressing corresponding harmonic signals can be fine-adjusted.

The reason for fine-adjusting lengths of respective stubs is as follows.

In particular, when realizing the reduction in the size of the filter 300b, respective stubs are formed at the external circumference of the alumina substrate 362, thus reducing apparent dielectric constant. For the purpose, electrical lengths of respective stubs are made short and those required for suppressing objective harmonic signals run short. Accordingly, when lengths of respective stubs are changed using the gold wire bonding or the adjustment lands 367, electrical lengths of respective stubs can be simply adjusted to those required for suppressing harmonic signals with high accuracy.

On the metal carrier 361, pedestals 368a, 368b, and 368c joined with gold-tin solder are formed. As the pedestals 368a, 368b, and 368c, pedestals obtained by coating gold tin on a surface layer of Kovar are used.

On the pedestals 368a and 368b, there are arranged alumina substrates 370a and 370b having mounted thereon coplanar waveguide-microstrip line converters (hereinafter, referred to as a CPW-MSL converter) 369a and 369b configured to measure characteristics of the filter 300b.

The alumina substrates 370a and 370b each have a thickness of approximately 150 μm, and are joined to the pedestals 368a and 368b with gold tin solder.

The CPW-MSL converters 369a and 369b are coupled to both ends of the transmission line 363 by gold wire bonding. FIG. 13 illustrates a state of connecting the transmission line 363 and the CPW-MSL converter 369b through a gold wire 371.

In addition, when actually using the above-described filter 300b for the transmitter-receiver, a switching circuit or amplifier is coupled to both ends of the transmission line 363. In that case, the CPW-MSL converters 369a and 369b may be removed.

Further, the short-end stub 366 is coupled to the pedestal 368c by gold wire bonding, thus grounding the short-end stub 366.

The filters 300 and 300a illustrated in FIGS. 7 and 10 cause the short-end stub 351 to be short-circuited with the ground through the connection via. In the above-described filter 300b, the short-end stub 366 is electrically connected to the metal carrier 361 serving as the ground by the gold wire bonding. This process permits the short-end stub 366 to be short-circuited with the ground using a simple configuration.

Figure 14:
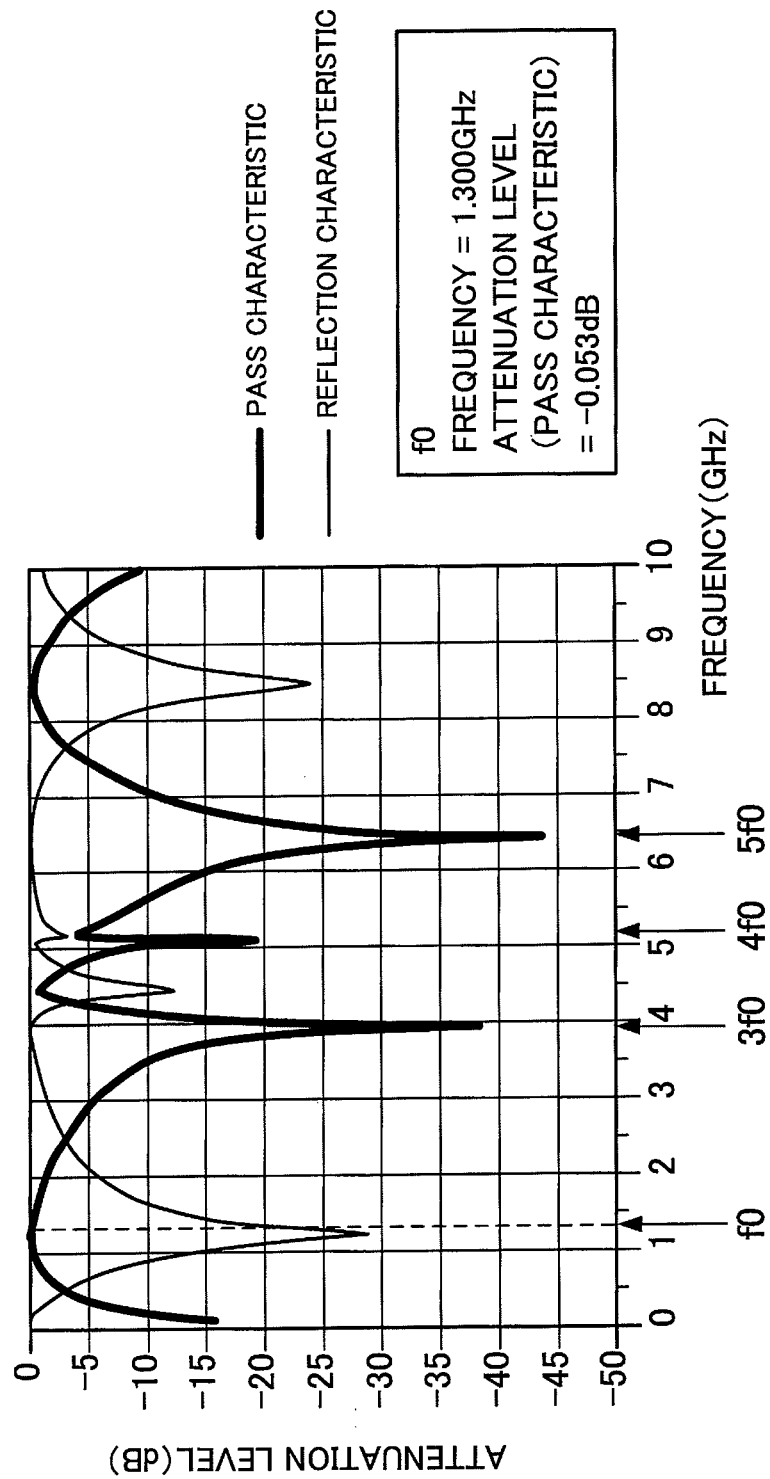
FIG. 14 illustrates a measurement result of pass characteristics of the filter as the prototype of FIG. 13.

FIG. 14 illustrates a measurement result of pass characteristic of the filter 300b as the prototype illustrated in FIG. 13. The horizontal axis of the graph of FIG. 14 represents the frequency (GHz), and the vertical axis represents the attenuation level (dB). In addition, FIG. 14 illustrates transmission characteristic and reflection characteristic of signals supplied from one end (CPW-MSL converter 369b side) of the transmission line 363 assumed to be coupled to an amplifier, and also illustrates the same characteristics as those of signals supplied from the other end of the transmission line 363.

As can be confirmed from the graph of FIG. 14, the filter 300b as the prototype illustrates the same characteristics as those of the simulation results illustrated in FIG. 11. That is, as can be seen from the pass characteristic illustrated in FIG. 14, the odd harmonic signals 3$f0$ and 5$f0$ are largely attenuated. As can be seen from the graph of FIG. 14, in the pass characteristic of 1.300 GHz as the frequency of the fundamental wave signal f0, the attenuation level of −0.053 dB is attained and the fundamental wave signal f0 is scarcely attenuated. Further, as can be seen from the graph of FIG. 14, the fourth harmonic signal 4$f0$ also is attenuated.

As can be seen from the above-described measurement results, effects of the filter 300b as the prototype according to the third embodiment can be verified.

Fourth Embodiment

Figure 15:
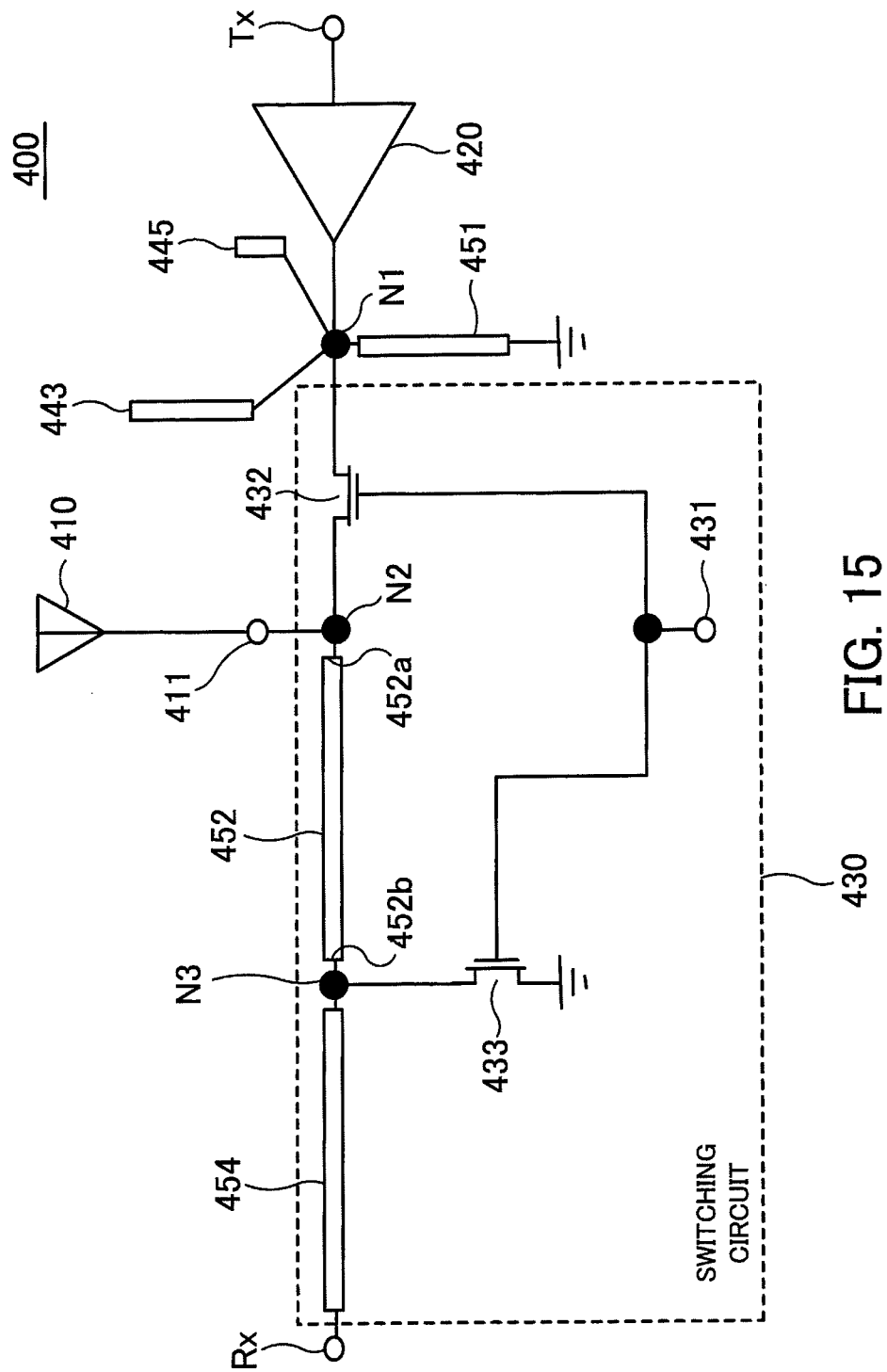
FIG. 15 illustrates one example of a transmitter-receiver according to a fourth embodiment.

A transmitter-receiver according to a fourth embodiment corresponds to that obtained by applying the filter 200 according to the first embodiment to a transmitter-receiver. FIG. 15 illustrates one example of the transmitter-receiver according to the fourth embodiment.

The illustrated transmitter-receiver 400 includes a transmission terminal Tx, a reception terminal Rx, an antenna terminal 411, an amplifier 420 coupled between the transmission terminal Tx and the antenna terminal 411, and a switching circuit 430 coupled between the antenna terminal 411, the reception terminal Rx, and the amplifier 420. The antenna terminal 411 is coupled to an antenna 410.

Here, operations of the transmitter-receiver 400 will be simply described. At the time of transmission, the switching circuit 430 electrically connects between the transmission terminal Tx and the antenna terminal 411, whereby a transmission signal supplied to the transmission terminal Tx from a transmission circuit (not illustrated) is amplified by the amplifier 420 and output to the antenna 410 from the antenna terminal 411. On the other hand, at the time of reception, the switching circuit 430 electrically connects between the reception terminal Rx and the antenna terminal 411, whereby a reception signal supplied to the antenna terminal 411 is output to a reception circuit (not illustrated) from the reception terminal Rx.

From here, a description of a configuration of the transmitter-receiver 400 will be continued again. To the transmission terminal Tx, the fundamental wave signal f0 is supplied as transmission signals. A frequency of the fundamental wave signal f0 is, for example, 1.300 GHz. When amplifying and outputting the fundamental wave signal f0, the amplifier 420 generates and outputs harmonic signals having an integer multiple of the frequency of the fundamental wave signal f0. Here, suppose that the second harmonic signal 2f0 having twice the frequency, the third harmonic signal 3f0 having three times the frequency, the fourth harmonic signal 4f0 having four times the frequency, the fifth harmonic signal 5f0 having five times the frequency, and the sixth harmonic signal 6f0 having six times the frequency are generated. In addition, an output signal from the amplifier 420 has a high output of several hundred W.

Further, the transmitter-receiver 400 has the open-end stubs 443 and 445 and short-end stubs 451 and 452 coupled between the antenna terminal 411 and the output side of the amplifier 420. Here, the short-end stub 452 is provided within the switching circuit 430.

The open-end stubs 443 and 445 and the short-end stub 451 are coupled to a node N1 of the output side of the amplifier 420. The open-end stubs 443 and 445 are provided corresponding to the odd harmonic signals 3f0 and 5f0 among the harmonic signals 2f0 to 6f0, respectively.

Here, the open-end stub 443 has a length corresponding to one quarter of the wavelength $\lambda 3f0$ of the third harmonic signal 3f0. The open-end stub 445 has a length corresponding to one quarter of the wavelength $\lambda 5f0$ of the fifth harmonic signal 5f0. The number of the open-end stubs is not limited to the two open-end stubs 443 and 445, and open-end stubs are appropriately provided according to the number of the odd harmonic signals to be suppressed. The short-end stub 451 has a length corresponding to one eighth of the wavelength $\lambda f0$ of the fundamental wave signal f0.

The switching circuit 430 has a control terminal 431, transistors 432 and 433, a node N2 coupled to the antenna terminal 411, and a node N3 coupled to the reception terminal Rx through a transmission line 454.

The transistor 432 is coupled between the nodes N1 and N2, and a control electrode is coupled to the control terminal 431. The transistor 432 controls a conductive state between the nodes N1 and N2 corresponding to signals supplied to the control terminal 431.

The transistor 433 is coupled between a node N3 and a ground line, and a control electrode is coupled to the control terminal 431. The transistor 433 controls a conductive state between the node N3 and the ground line corresponding to signals supplied to the control terminal 431. In addition, as the transistors 432 and 433, for example, field-effect transistors are used.

In the short-end stub 452, one end 452a is coupled to the node N2, and the other end 452b is coupled to the node N3 in a short circuit state at the time when the transistor 433 is turned on. The short-end stub 452 has a length corresponding to one quarter of the wavelength $\lambda f0$ of the fundamental wave signal f0.

A transmission line 454 is coupled between the node N3 and the reception terminal Rx, and preferably has a length corresponding to one quarter of the wavelength $\lambda f0$ of the fundamental wave signal f0.

Next, an operation of the transmitter-receiver 400 will be described in detail.

At the time of transmission, the fundamental wave signal f0 as transmission signals is supplied to the transmission terminal Tx. The fundamental wave signal f0 supplied to the transmission terminal Tx is amplified by the amplifier 420. At this time, the harmonic signals 2f0 to 6f0 are generated and the fundamental wave signal f0 and the harmonic signals 2f0 to 6f0 are output to the node N1. Among them, the open-end stubs 443 and 445 suppress the odd harmonic signals 3f0 and 5f0. Further, the short-end stub 451 reduces the attenuation amount of the fundamental wave signal f0.

Further, at the time of transmission, an input signal to the control terminal 431 is switched over, and the transistors 432 and 433 are turned on. As a result, a portion between the node N1 and the antenna terminal 411 is made conductive and the fundamental wave signal f0 is wirelessly transmitted outwards from the antenna 410. Since the node N3 is grounded, the possibility that the fundamental wave signal f0 sneaks into the reception terminal Rx is suppressed. Further, since the end 452b of the short-end stub is grounded, the even harmonic signals 2f0, 4f0, and 6f0 are suppressed.

On the other hand, at the time of reception, an input signal to the control terminal 431 is switched over, and the transistors 432 and 433 are turned off. As a result, a reception signal received by the antenna 410 is output from the reception terminal Rx via the antenna terminal 411, the node N2, and the node N3. At this time, a route to the transmission terminal Tx is shut off. On the other hand, at this time, the short-end stub 452 is prevented from being grounded and merely functions as a transmission line.

As can be seen from the above discussion, the proposed transmitter-receiver 400 permits the harmonic signals 2f0 to 6f0 to be suppressed and the attenuation amount of the fundamental wave signal f0 as a transmission signal to be reduced. Further, since the short-end stub 452 configured to suppress the even harmonic signals 2f0, 4f0, and 6f0 is provided within the switching circuit 430, the reduction in the size of the transmitter-receiver 400 can be realized.

Modification Example 1

Figure 16:
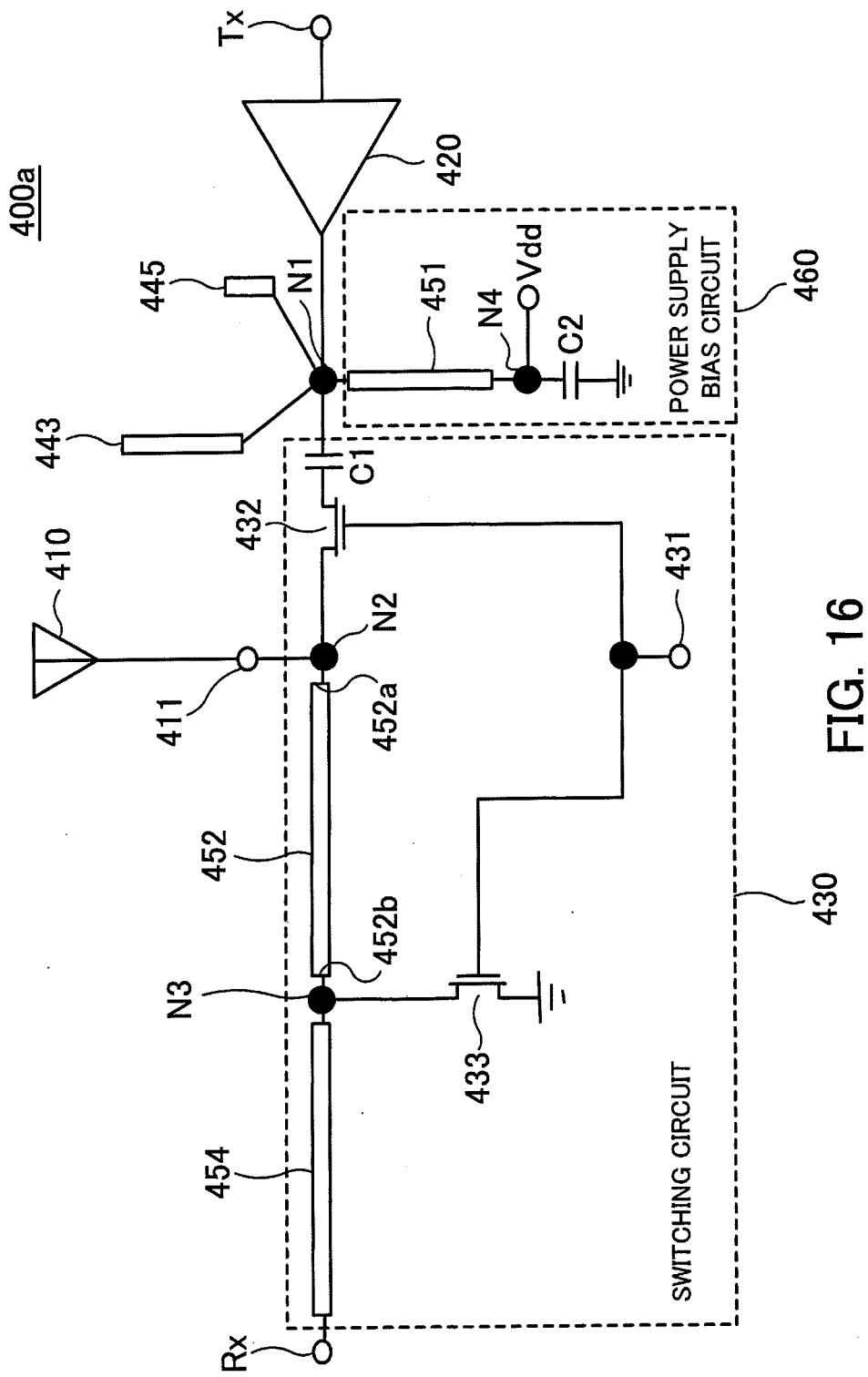
FIG. 16 illustrates a first modification example of the transmitter-receiver according to the fourth embodiment.

FIG. 16 illustrates a first modification example of the transmitter-receiver according to the fourth embodiment. When circuit components illustrated in FIG. 16 are the same as those of the transmitter-receiver 400 described in FIG. 15, the same reference numerals are given to them.

In this transmitter-receiver 400a, the short-end stub 451 is used as a transmission line of a power supply bias circuit 460 coupled to an output of the amplifier 420.

In the power supply bias circuit 460, a power supply voltage Vdd is applied to a node N4 between the short-end stub 451 and the ground line.

A capacitor C1 for cutting a direct current (DC) component is coupled between the node N1 and the transistor 432, and a capacitor C2 for bypass is coupled between the node N4 and the ground line.

As described above, load impedance viewed from the node N1 connecting the open-end stubs 443 and 445 and the short-end stub 451 having a length corresponding to one eighth of the wavelength $\lambda f0$ of the fundamental wave signal f0 is open for the fundamental wave signal f0. In short, the attenuation amount of the fundamental wave signal f0 is reduced.

In the power supply bias circuit 460 for the amplifier 420, for the purpose of suppressing an output signal from the amplifier 420 from flowing to the power supply bias circuit side and causing loss, the transmission line having a length corresponding to one quarter of the wavelength λf0 of the fundamental wave signal f0 is frequently used. In the power supply bias circuit 460 of the transmitter-receiver 400a according to the present embodiment, the short-end stub 451 having a length corresponding to one eighth of the wavelength λf0 of the fundamental wave signal f0 can be used in place of the transmission line having a length corresponding to one quarter of the wavelength λf0 of the fundamental wave signal f0. Therefore, the proposed transmitter-receiver 400a permits a compact power supply bias circuit with low loss to be realized.

Modification Example 2

Figure 17:
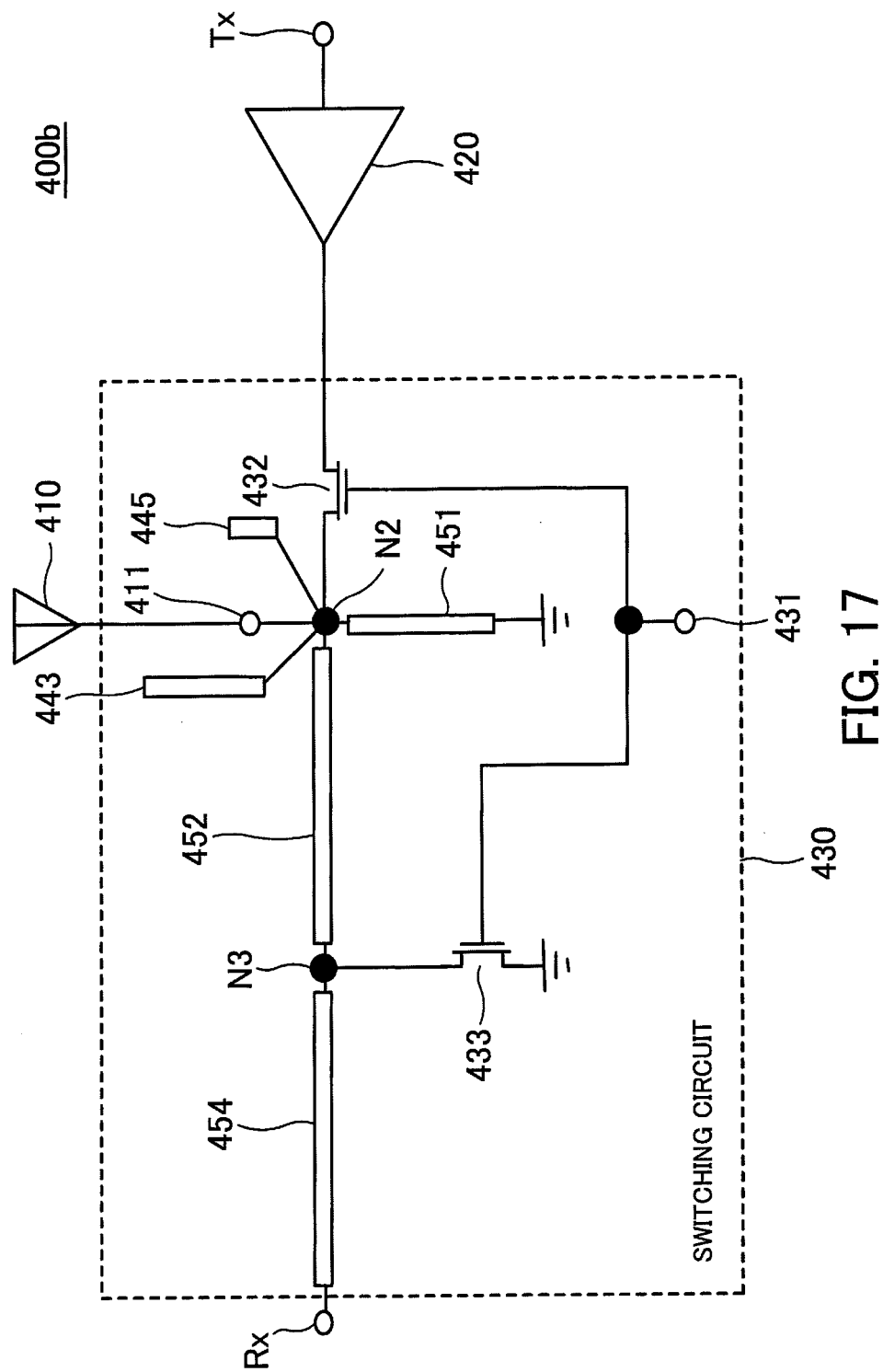
FIG. 17 illustrates a second modification example of the transmitter-receiver according to the fourth embodiment.

FIG. 17 illustrates a second modification example of the transmitter-receiver 400 according to the fourth embodiment. When circuit components illustrated in FIG. 17 are the same as those of the transmitter-receiver 400 described in FIG. 15, the same reference numerals are given to them. The illustrated transmitter-receiver 400b of the second modification example is a transmitter-receiver obtained by changing connection positions of the open-end stubs 443 and 445 and short-end stub 451 of the transmitter-receiver 400.

In the transmitter-receiver 400b, the open-end stubs 443 and 445 and the short-end stub 451 are provided within the switching circuit 430, and coupled to the node N2.

This configuration of the transmitter-receiver 400b permits not only harmonic signals caused by the amplifier 420 but also those caused by the switching circuit 430 to be suppressed. Further, the reduction in the size of the transmitter-receiver 400 can be realized again.

In addition, in the same manner as in the transmitter-receiver 400, the transmitter-receiver 400b permits the harmonic signals 2f0 to 6f0 to be suppressed and the attenuation amount of the fundamental wave signal f0 as a transmission signal to be reduced.

Fifth Embodiment

Hereinafter, an example of a class F amplifying circuit to which the filter 200 according to the first embodiment is applied will be described.

Figure 18:
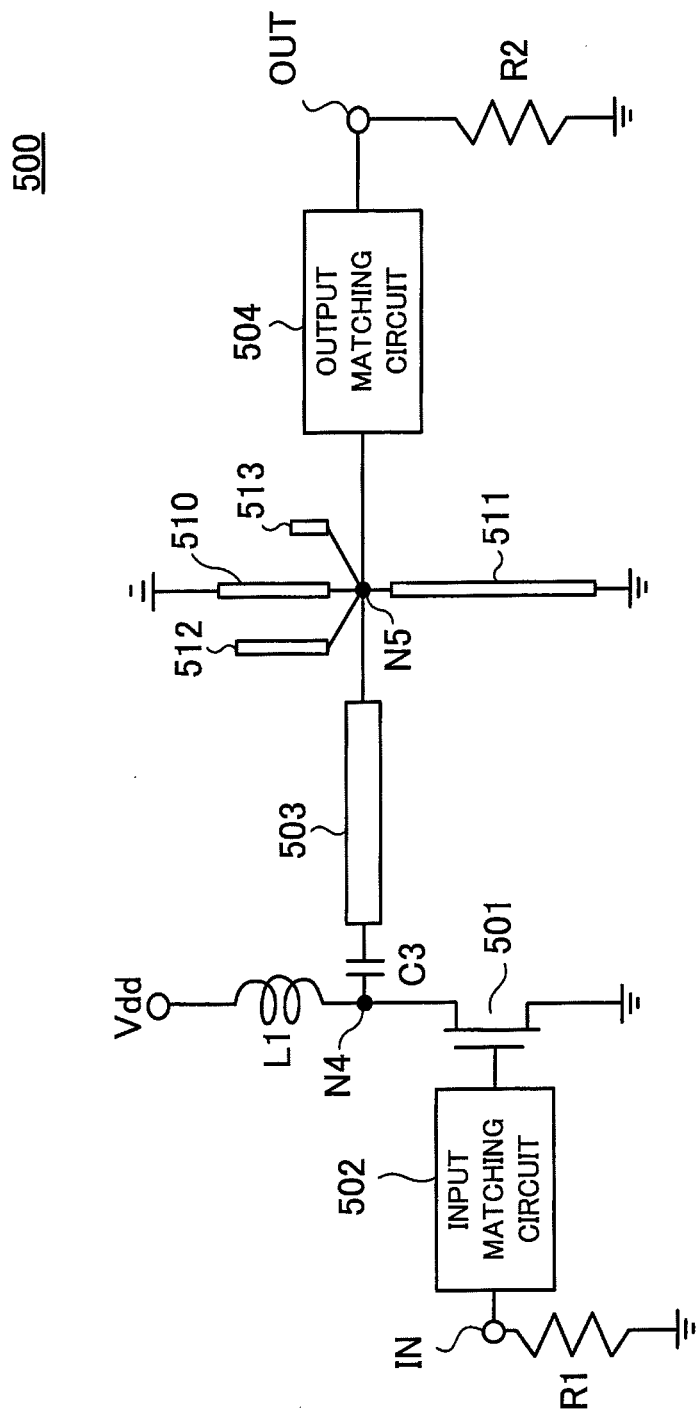
FIG. 18 illustrates one example of a class F amplifying circuit according to a fifth embodiment.

FIG. 18 illustrates one example of a class F amplifying circuit according to a fifth embodiment.

The illustrated class F amplifying circuit 500 includes a transistor 501 configured to amplify the fundamental wave signal f0 and an input matching circuit 502 configured to be coupled between a control terminal of the transistor 501 and an input terminal IN to which the fundamental wave signal f0 is supplied and which matches an input. As the transistor 501, for example, a field-effect transistor or bipolar transistor is used.

The transistor 501 is coupled between the node N4 and the ground line, and the power supply voltage Vdd is applied to the node N4 coupled to an output terminal of the transistor 501 through a choke coil L1. To the node N4, a capacitor C3 for cutting a DC component is coupled and further, a transmission line 503 having a length corresponding to one quarter of the wavelength λf0 of the fundamental wave signal f0 and an output matching circuit 504 configured to match an output are coupled serially thereto. Further, the output matching circuit 504 is coupled to an output terminal OUT.

In the class F amplifying circuit 500 according to the present embodiment, short-end stubs 510 and 511 and open-end stubs 512 and 513 are coupled to a node N5 between the transmission line 503 and the output matching circuit 504. The short-end stubs 510 and 511 correspond to the short-end stubs 251 and 252 of the filter 200 illustrated in FIG. 2, respectively, and the open-end stubs 512 and 513 correspond to the open-end stubs 243 and 245 of the filter 200 illustrated in FIG. 2, respectively. The short-end stubs and the open-end stubs according to the fifth embodiment may have substantially the same functions as those according to the first embodiment, respectively.

In addition, to the input terminal IN and the output terminal OUT, terminating resistances R1 and R2 are coupled, respectively. Values of the terminating resistances R1 and R2 are, for example, 50Ω.

Figure 19:
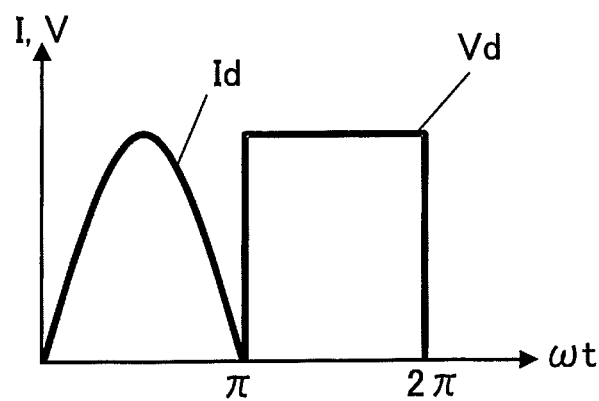
FIG. 19 illustrates a state of a current waveform and voltage waveform of a transistor at the time when an ideal class F amplifying circuit is operated.

FIG. 19 illustrates a state of a current waveform and voltage waveform of a transistor at the time when an ideal class F amplifying circuit is operated. The horizontal axis represents the phase (ωt), and the vertical axis represents the voltage V and the current I. The transistor 501 used is assumed to be a field effect transistor and FIG. 19 illustrates a state of a drain current waveform Id and drain voltage waveform Vd of a drain as an output terminal.

In FIG. 19, a current waveform is set to a half-wave rectification waveform based on the fundamental wave signal and the even harmonic signals, and a voltage waveform is set to a square wave opposite in phase to the current waveform based on the fundamental wave signal and the odd harmonic signals. This process permits an overlap between the current waveform and the voltage waveform to be eliminated and power consumption to be equal to zero. In short, an operating efficiency of 100% is obtained.

The above-described waveform can be realized using the following method. That is, load impedance viewed from the node N4 of the output side of the transistor 501 is set to zero, namely, to be short for the even harmonic signals, and on the other hand to infinity, namely, to be open for the odd harmonic signals.

In the class F amplifying circuit 500 according to the present embodiment, load impedance viewed from the node N5 coupled to the short-end stubs 510 and 511 and the open-end stubs 512 and 513 is short for the even harmonic signals, the third harmonic signal 3f0, and the fifth harmonic signal 5f0. That is, the short-end stub 511 suppresses the even harmonic signals and the open-end stubs 512 and 513 suppress the odd harmonic signals. For the purpose, viewed from the node N5, the load impedance viewed from the node N4 located ahead of the transmission line 503 having a length corresponding to one quarter of the wavelength λf0 of the fundamental wave signal f0 is short for the even harmonic signals, and on the other hand, open for the third harmonic signal and the fifth harmonic signal. As a result, the class F amplifying circuit 500 with excellent operating efficiency is obtained.

In the same manner as in the above-described embodiment, the proposed class F amplifying circuit 500 permits the short-end stub 501 to suppress the fundamental wave signal from being attenuated.

Modification Example

Figure 20:
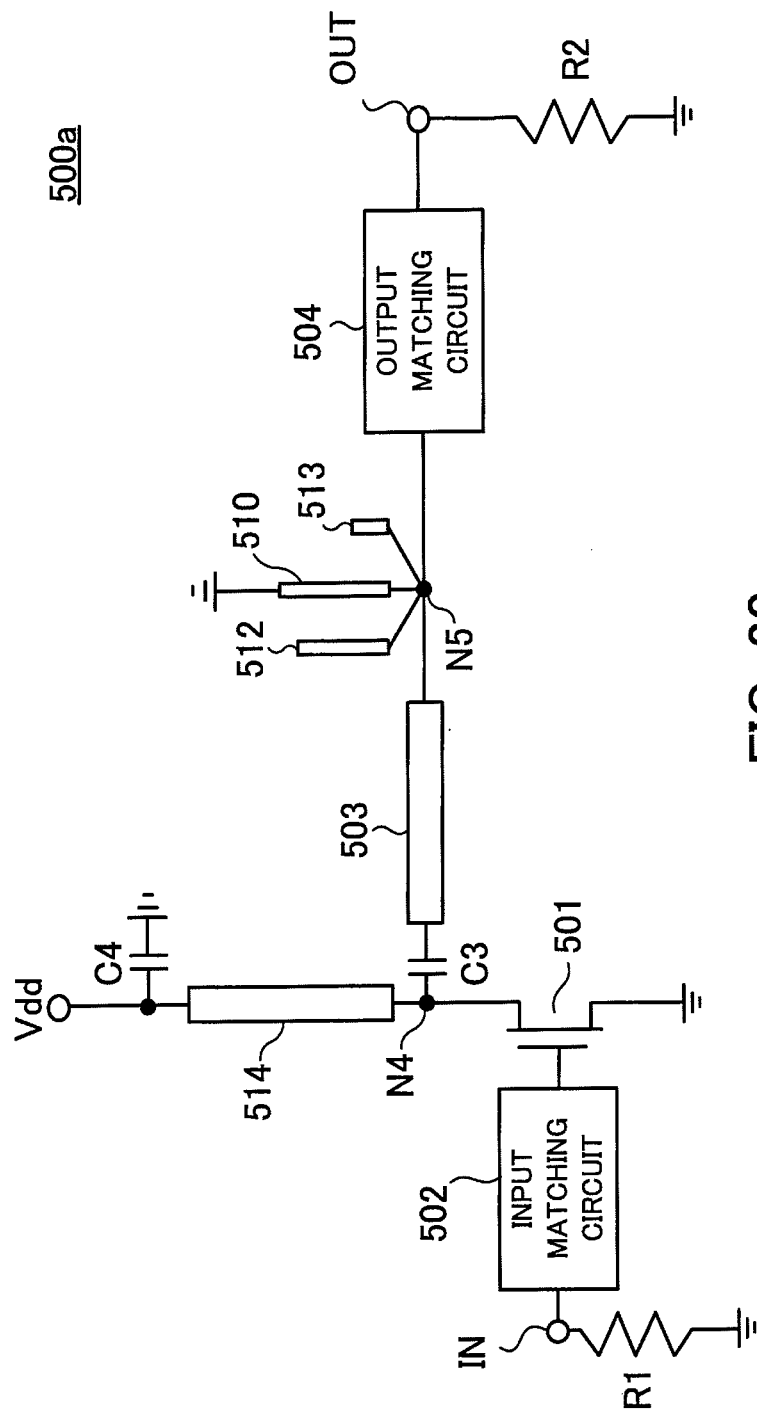
FIG. 20 illustrates a modification example of the class F amplifying circuit according to the fifth embodiment.

FIG. 20 illustrates a modification example of the class F amplifying circuit according to the fifth embodiment. When circuit components illustrated in FIG. 20 are the same as those of the class F amplifying circuit 500 described in FIG. 18, the same reference numerals are given to them.

This class F amplifying circuit 500a connects a transmission line 514 having a length corresponding to one quarter of the wavelength λf0 of the fundamental wave signal f0 to the node N4 in place of the choke coil L1 of the class F amplifying circuit 500 illustrated in FIG. 18. In the class F amplifying circuit 500a, a capacitor C4 for bypass is provided between the ground line and a node N6 between the transmission line 514 and a power line to which the power supply voltage Vdd is applied.

To the node N5, the short-end stub 511 illustrated in FIG. 18 is not coupled and the transmission line 514 of the power supply bias circuit side is used for this function of the short-end stub 511.

This process permits the class F amplifying circuit 500a to obtain the same effect as that of the class F amplifying circuit 500 illustrated in FIG. 18, and the reduction in the size of the class F amplifying circuit 500a to be realized.

As can be seen from various embodiments discussed above, the proposed filter, transmitter-receiver, and amplifying circuit permit harmonic signals to be suppressed and the attenuation amount of the fundamental wave signal to be reduced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that various changes, substitutions and alterations could be made hereto without departing from the spirit and scope of the invention.

What is claimed is:

1. A filter, comprising:
   an input terminal to which a fundamental wave signal and a harmonic signal group of the fundamental wave signal are supplied;
   an output terminal configured to output the fundamental wave signal supplied to the input terminal;
   a transmission line configured to connect the input terminal and the output terminal;
   an open-end stub configured to be provided corresponding to an odd harmonic signal among the harmonic signal group, coupled to the transmission line, and has a length corresponding to one quarter of a wavelength of the corresponding odd harmonic signal;
   a first short-end stub configured to be coupled to the transmission line and has a length corresponding to one quarter of a wavelength of the fundamental wave signal; and
   a second short-end stub configured to be coupled to the transmission line,
   wherein the second short-end stub has a length corresponding to one eighth of the wavelength of the fundamental wave signal.

2. The filter according to claim 1, wherein the open-end stub and the first and second short-end stubs are coupled to the transmission line at a common connection node.

3. The filter according to claim 1, further comprising:
   a substrate including a first surface and a second surface of an opposite side to the first surface;
   a connection via configured to be provided in the substrate, and configured to connect the first surface and the second surface; and
   a ground pattern configured to be formed at an upper part of the second surface of the substrate,
   wherein the first and second short-end stubs are formed at an upper part of the first surface of the substrate and electrically connected to the ground pattern through the connection via.

4. The filter according to claim 1, wherein a microstrip line structure is used for the open-end stub, the first short-end stub, and the second short-end stub.

5. A filter, comprising:
   an input terminal to which a fundamental wave signal and a harmonic signal group of the fundamental wave signal are supplied;
   an output terminal configured to output the fundamental wave signal supplied to the input terminal;
   a transmission line configured to connect the input terminal and the output terminal;
   an open-end stub configured to be provided corresponding to an odd harmonic signal among the harmonic signal group, coupled to the transmission line, and has a length corresponding to one quarter of a wavelength of the corresponding odd harmonic signal; and
   a short-end stub configured to be coupled to the transmission line and has a length corresponding to one eighth of a wavelength of the fundamental wave signal.

6. The filter according to claim 5, wherein the open-end stub and the short-end stub are coupled to the transmission line at a common connection node.

7. The filter according to claim 5, wherein the open-end stub and the short-end stub are provided at an upper part of a substrate, and each of the open-end stub and the short-end stub is bent to at least partly lie along a different side of a circumference of the substrate.

8. The filter according to claim 5, wherein the short-end stub is coupled to the transmission line through a wire.

9. The filter according to claim 5, wherein:
   a conductor part is provided in parallel to at least one of the open-end stub and the short-end stub; and
   the conductor part is coupled to said at least one of the open-end stub and the short-end stub through a wire.

10. A transmitter-receiver, comprising:
    a transmission terminal to which a fundamental wave signal as a transmission signal is supplied;
    a reception terminal configured to output a reception signal;
    an antenna terminal;
    an amplifier configured to be coupled between the transmission terminal and the antenna terminal, amplifies the fundamental wave signal supplied to the transmission terminal, and generates a harmonic signal group of the fundamental wave signal;
    a switching circuit configured to be provided between the antenna terminal, the amplifier, and the reception terminal, and performs a switching operation between transmission and reception;
    an open-end stub configured to be provided corresponding to an odd harmonic signal among the harmonic signal group, coupled between the antenna terminal and the amplifier, and has a length corresponding to one quarter of a wavelength of the corresponding odd harmonic signal;
    a first short-end stub configured to be provided within the switching circuit and has a length corresponding to one quarter of a wavelength of the fundamental wave signal; and
    a second short-end stub configured to be coupled between the antenna terminal and the amplifier.

11. The transmitter-receiver according to claim 10, wherein the second short-end stub has a length corresponding to one eighth of the wavelength of the fundamental wave signal.

12. The transmitter-receiver according to claim 10, wherein the open-end stub and the second short-end stub are coupled to a common connection node between the antenna terminal and the amplifier.

13. The transmitter-receiver according to claim 10, wherein:
- a transmission line of a power supply bias circuit coupled to the amplifier includes the second short-end stub and a ground line coupled to the second short-end stub; and
- a power supply voltage is applied between the second short-end stub and the ground line.

14. The transmitter-receiver according to claim 10, wherein the second short-end stub and the open-end stub are provided within the switching circuit.

15. An amplifying circuit, comprising:
- an input terminal to which a fundamental wave signal is supplied;
- a transistor which amplifies the fundamental wave signal;
- a transmission line configured to be coupled to an output terminal of the transistor and has a length corresponding to one quarter of a wavelength of the fundamental wave signal;
- an open-end stub configured to be coupled between the transmission line and an output terminal of the amplifying circuit, is provided corresponding to an odd harmonic signal of the fundamental wave signal, and has a length corresponding to one quarter of a wavelength of the corresponding odd harmonic signal; and
- a short-end stub configured to be coupled between the transmission line and the output terminal of the amplifying circuit.

16. The amplifying circuit according to claim 15, wherein the short-end stub has a length corresponding to one eighth of the wavelength of the fundamental wave signal.

17. The amplifying circuit according to claim 15, wherein the open-end stub and the short-end stub are coupled to the transmission line at a common connection node.

18. The amplifying circuit according to claim 15, wherein another short-end stub having a length corresponding to one quarter of the wavelength of the fundamental wave signal is further coupled between the transmission line and the output terminal of the amplifying circuit.

19. The amplifying circuit according to claim 15, wherein:
- between the output terminal of the transistor and a ground line, another short-end stub having a length corresponding to one quarter of the wavelength of the fundamental wave signal is further coupled; and
- between the another short-end stub and the ground line, a power supply voltage is applied.

* * * * *